United States Patent
Taguchi et al.

(10) Patent No.: US 9,684,301 B2
(45) Date of Patent: Jun. 20, 2017

(54) COMPUTER PRODUCT, ASSEMBLY SEQUENCE GENERATING APPARATUS, AND MANUFACTURING METHOD

(71) Applicant: FUJITSU LIMITED, Kawasaki-shi, Kanagawa (JP)

(72) Inventors: Terutoshi Taguchi, Ichikawa (JP); Tsukasa Kanoko, Koto (JP); Tsutomu Kumagai, Chiba (JP)

(73) Assignee: FUJITSU LIMITED, Kawasaki (JP)

( * ) Notice: Subject to any disclaimer, the term of this patent is extended or adjusted under 35 U.S.C. 154(b) by 261 days.

(21) Appl. No.: 14/037,654

(22) Filed: Sep. 26, 2013

(65) Prior Publication Data
US 2014/0121801 A1    May 1, 2014

(30) Foreign Application Priority Data
Nov. 1, 2012   (JP) .................. 2012-242246

(51) Int. Cl.
*G05B 19/4097* (2006.01)
*G05B 19/418* (2006.01)
*G06F 17/50* (2006.01)

(52) U.S. Cl.
CPC ... *G05B 19/41805* (2013.01); *G06F 17/5086* (2013.01); *Y10T 29/49* (2015.01)

(58) Field of Classification Search
CPC  G05B 19/41805; G06F 17/5086; Y10T 29/49
See application file for complete search history.

(56) References Cited

U.S. PATENT DOCUMENTS

| | | | | |
|---|---|---|---|---|
| 5,980,084 A | * | 11/1999 | Jones | G05B 19/41805 700/103 |
| 6,157,902 A | | 12/2000 | Hirata et al. | |
| 6,434,438 B1 | * | 8/2002 | Jin | G06Q 99/00 340/3.1 |
| 6,725,184 B1 | * | 4/2004 | Gadh | G05B 19/41805 700/95 |
| 7,979,251 B2 | * | 7/2011 | Jakobsen | G06T 17/10 700/95 |

(Continued)

FOREIGN PATENT DOCUMENTS

| | | |
|---|---|---|
| EP | 2 458 562 A1 | 5/2012 |
| JP | 07-311792 | 11/1995 |

(Continued)

OTHER PUBLICATIONS

Korean Office Action issued on Nov. 3, 2014 in corresponding Korean Patent Application No. 10-2013-0115654.

(Continued)

*Primary Examiner* — Charles Kasenge
(74) *Attorney, Agent, or Firm* — Staas & Halsey LLP

(57) ABSTRACT

An assembly sequence generating apparatus includes a computer that has a display control unit (301) that causes a display unit to display a 3-D model; a setting unit (302) that, when parts included in the 3-D model displayed on the display unit are sequentially selected, sets the selected parts to not be displayed; and a storing unit (304) that stores to a memory unit, a reverse sequence of a sequence of the selection of the parts as an assembly sequence of the 3-D model.

4 Claims, 18 Drawing Sheets

(56) References Cited

U.S. PATENT DOCUMENTS

| | | | | |
|---|---|---|---|---|
| 8,374,829 B2* | 2/2013 | Jakobsen | ................ | G06T 17/10 345/8 |
| 2002/0128810 A1* | 9/2002 | Craig | ................ | G05B 17/02 703/17 |
| 2008/0228450 A1* | 9/2008 | Jakobsen | ................ | G06T 17/10 703/2 |
| 2012/0130521 A1* | 5/2012 | Kohlhoff | ................ | G06T 19/00 700/98 |
| 2012/0156662 A1* | 6/2012 | Mital | ................ | G09B 19/00 434/219 |
| 2013/0218527 A1* | 8/2013 | Callahan | ................ | G06F 17/50 703/1 |

FOREIGN PATENT DOCUMENTS

| | | |
|---|---|---|
| JP | 10-312208 | 11/1998 |
| JP | 2000-141152 | 5/2000 |
| JP | 2001-353631 | 12/2001 |
| JP | 2005-275945 | 10/2005 |
| JP | 2008-046924 | 2/2008 |

OTHER PUBLICATIONS

Korean Office Action dated Apr. 1, 2015 in corresponding Korean Patent Application No. 10-2013-0115654.
Korean Office Action dated Sep. 9, 2015 in corresponding Korean Patent Application No. 10-2013-0115654.
Office Action issued by the State Intellectual Property Office of P.R. China on May 3, 2016 in corresponding Chinese patent application No. 201310452189.3.
Office Action issued by the Japanese Patent Office on Jun. 28, 2016 in corresponding Japanese patent application No. 2012-242246.
Office Action issued by the State Intellectual Property Office of the P.R. of China on Feb. 20, 2017 in corresponding Chinese patent application No. 201310452189.3.
Office Action issued by the State Intellectual Property Office of the P.R. of China on Oct. 28, 2016 in corresponding Chinese patent application No. 201310452189.3.

* cited by examiner

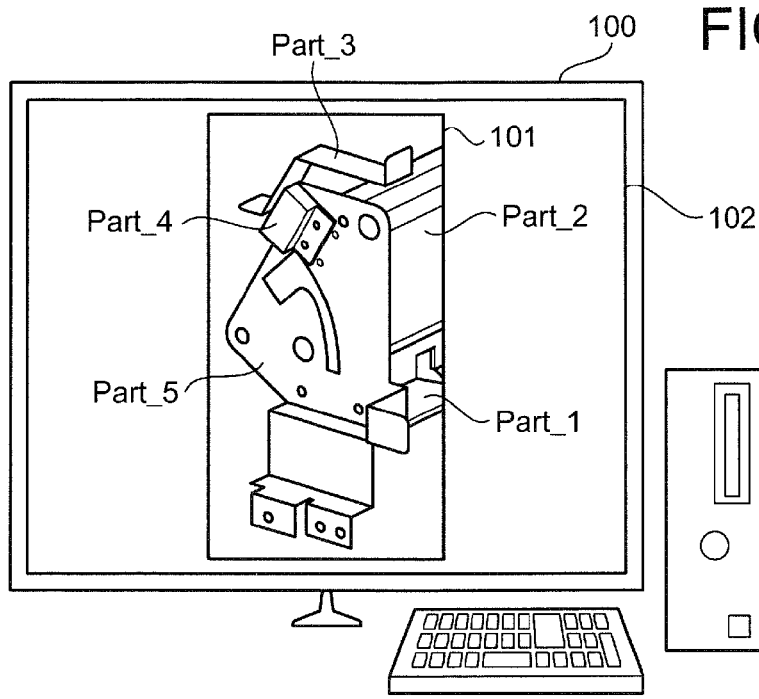
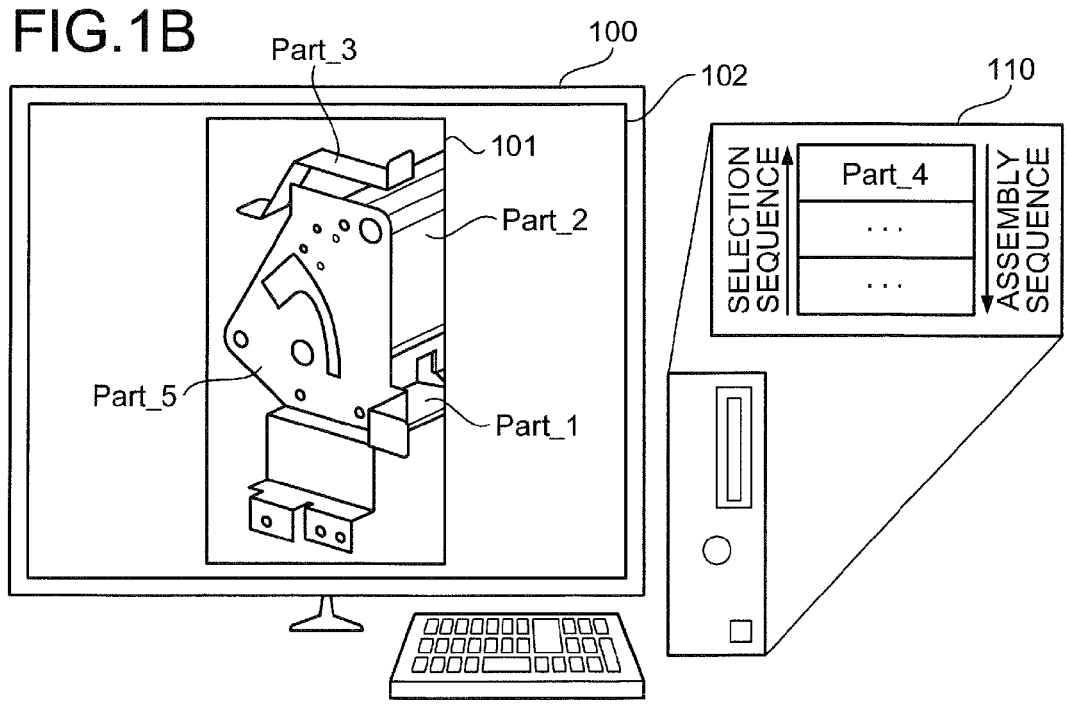

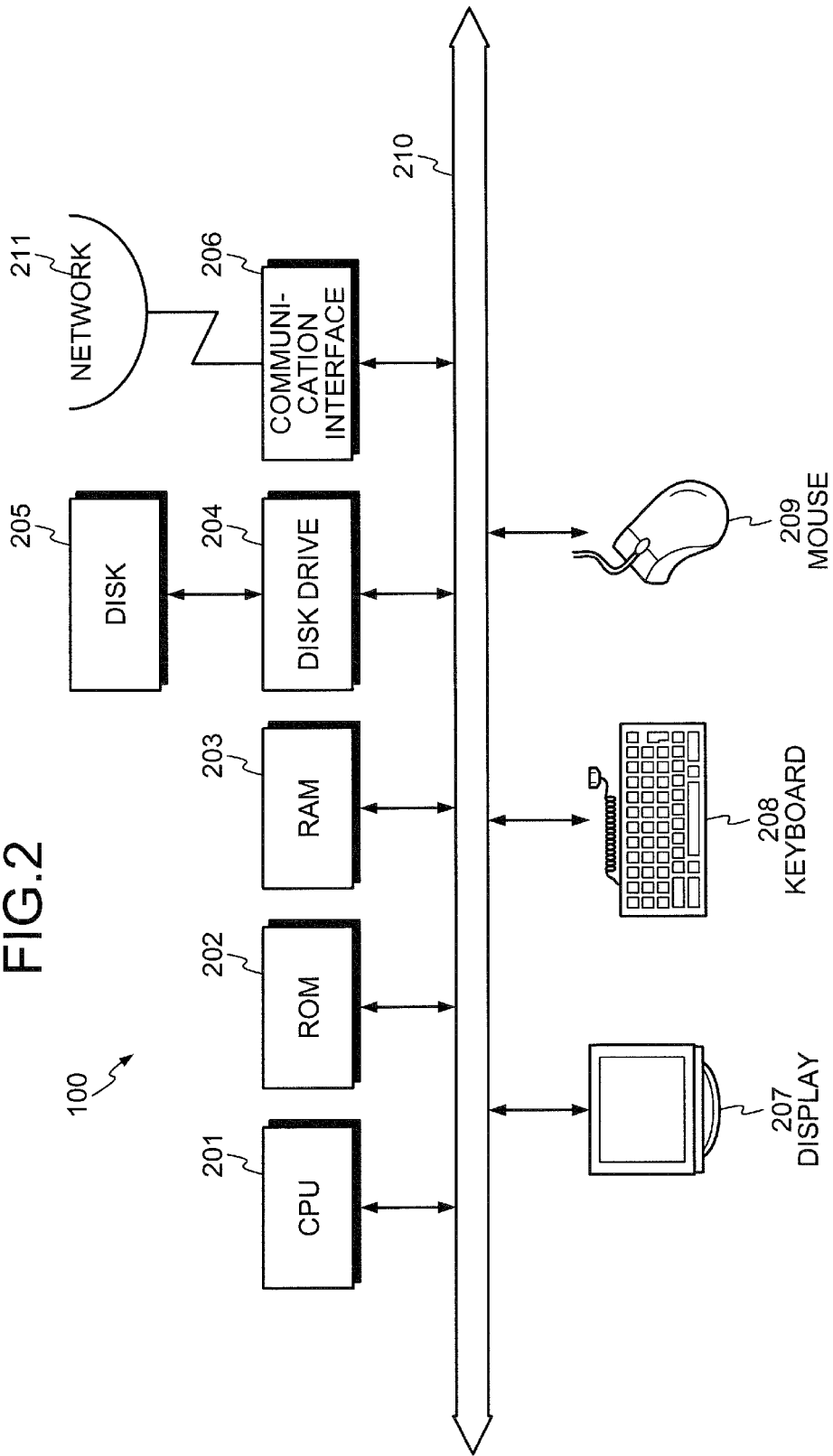

| PART NAME | ORIGIN COORDINATES OF PART | LOCAL COORDINATE SYSTEM | COLOR INFORMATION | SHAPE INFORMATION |
|---|---|---|---|---|
| PART Part_1 | P1(xg,yg,zg) | CONVERSION MATRIX R1 | (r1,g1,b1) | FACET 1: VERTEX v_11(xl_11,yl_11,zl_11), VERTEX v_12(xl_12,yl_12,zl_12), VERTEX v_13(xl_13,yl_13,zl_13) NORMAL VECTOR Vec_1 ... FACET N: VERTEX v_N1(xl_N1,yl_N1,zl_N1), VERTEX v_N2(xl_N2,yl_N2,zl_N2), VERTEX v_N3(xl_N3,yl_N3,zl_N3) NORMAL VECTOR Vec_N |

PART DATA — 311

401-1

FACET N v_N2  Vec_N  v_N1 v_N3

FACET N

FACET 1

Part_1

FIG.7A1 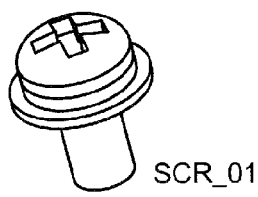
FIG.7A2 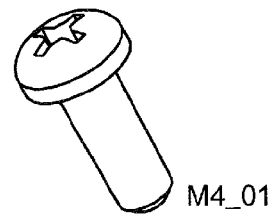
FIG.7B
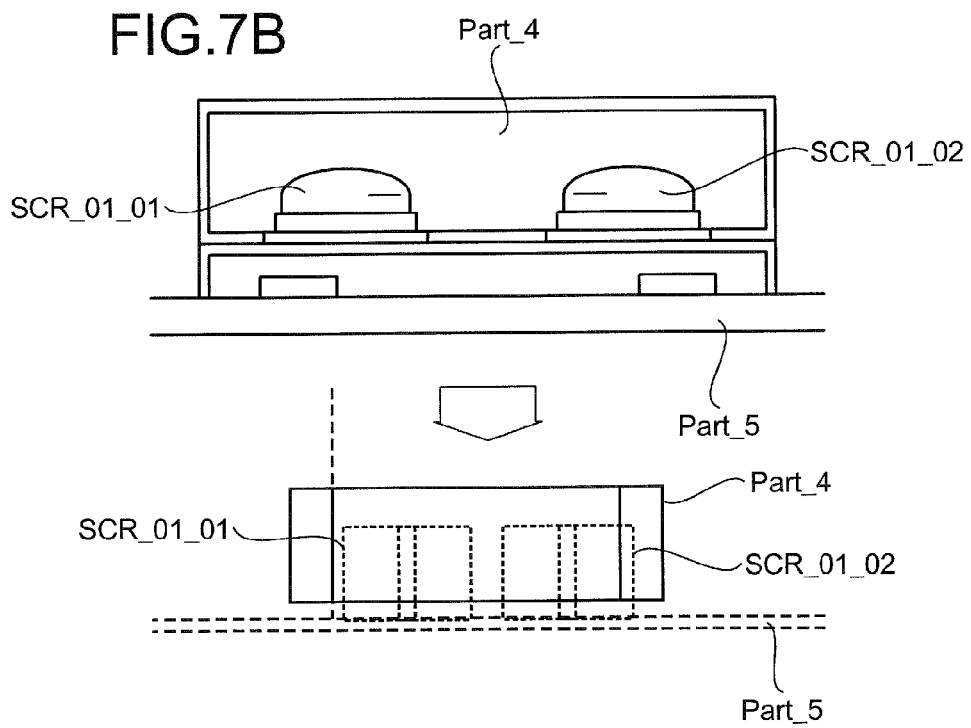
FIG.7C1
| FASTENING PART | PART TO BE FASTENED | |
|---|---|---|
| SCR_01_01 | Part_5 | Part_4 |
| SCR_01_02 | Part_5 | Part_4 |
701
701-1
701-2
FIG.7C2
| PART TO BE FASTENED | ASSOCIATED FASTENING PART | |
|---|---|---|
| Part_4 | SCR_01_01 | SCR_01_02 |
| Part_5 | SCR_01_01 | SCR_01_02 |
702
702-1
702-2

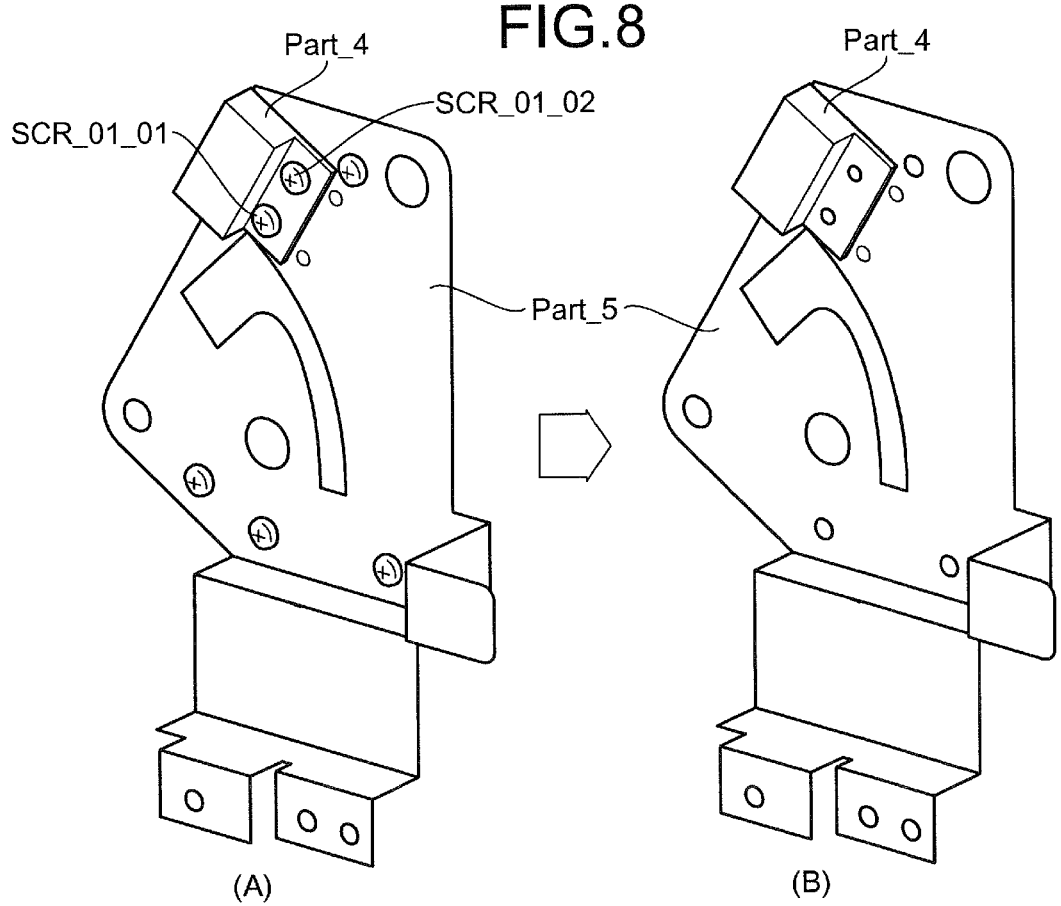

FIG.10A
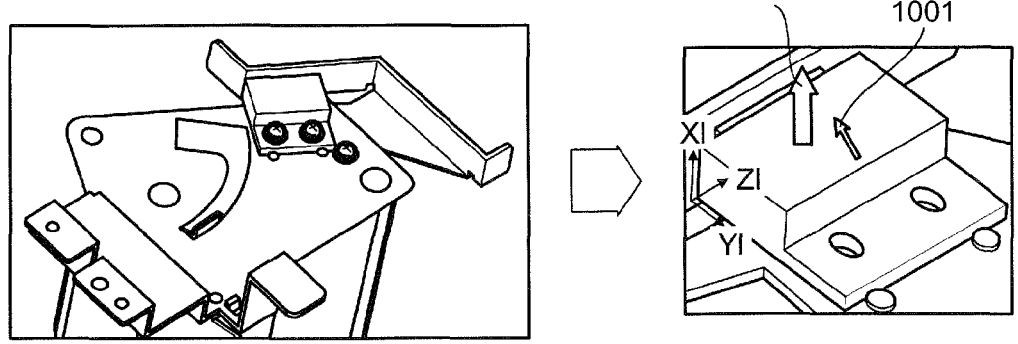
FIG.10B1
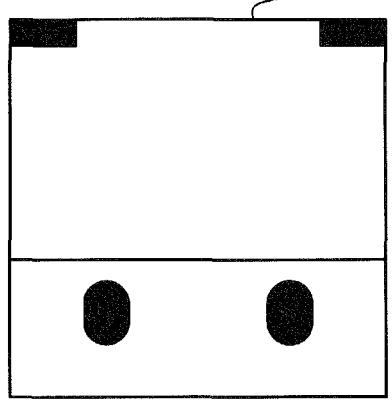
FIG.10B2
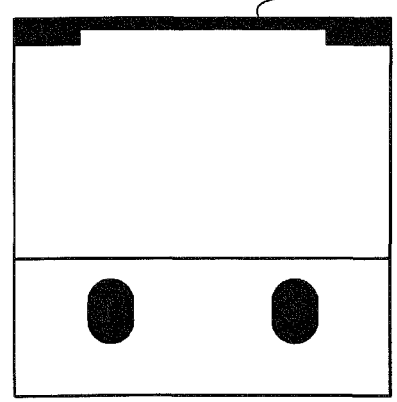
FIG.10C
DEGREE OF EASE OF DISASSEMBLY=NUMBER OF WHITE PIXELS OF D2/NUMBER OF WHITE PIXELS OF D1*100
| DEGREE OF EASE OF DISASSEMBLY | COLOR |
|---|---|
| 90 - 100 | BLUE |
| 80 - 89 | YELLOW |
| - 79 | RED |

| FLOW | NAME |
|------|------|
| ▷ | Part_3 |
| ▷ | UNIT_1 |
| ▷ | SCR_02_01 |
| ▷ | SCR_02_02 |
| ▷ | SCR_02_03 |
| ▷ | SCR_01_01 |
| ▷ | SCR_01_02 |
| ▷ | Part_2 |
| ▷ | Part_1 |
| ▷ | Part_5 |
| ▷ | PIN_01 |
| ▷ | Part_4 |
| ▷ | UNIT_2 |
| ▷ | Unit |

1102

| FLOW | NAME |
|------|------|
| ▷ | Part_3 |
| ▷ | UNIT_1 |
| ▷ | SCR_02_01 |
| ▷ | SCR_02_02 |
| ▷ | SCR_02_03 |
| ▷ | Part_2 |
| ▷ | Part_1 |
| ▷ | PIN_01 |
| ▷ | Part_4 |
| ▷ | UNIT_2 |
| ▷ | Part_5 |
| ▷ | SCR_01_01 |
| ▷ | SCR_01_02 |
| ▷ | Unit |

COMPUTER PRODUCT, ASSEMBLY SEQUENCE GENERATING APPARATUS, AND MANUFACTURING METHOD

CROSS REFERENCE TO RELATED APPLICATIONS

This application is based upon and claims the benefit of priority of the prior Japanese Patent Application No. 2012-242246, filed on Nov. 1, 2012, the entire contents of which are incorporated herein by reference.

FIELD

The embodiment discussed herein is related to an assembly sequence generation and a manufacturing method.

BACKGROUND

A technique has conventionally been present to generate an assembly sequence of a product from the computer aided design (CAD) data thereof. For example, a technique is present to generate an assembly sequence of a product using assembly constraint information that constrains adjacency relations among the parts forming an assembly model and position relations thereamong. According to another technique, evaluation factors are read from a database. The evaluation factors correspond to part properties of parts that form a product from three-dimensional data and work contents therefor; and image data of the parts are edited using colors that correspond to the evaluation scores corresponding to difficulty of assembling and disassembling related to the parts. Another technique is present to generate quantitative assembly data based on assembly information based on a shape model of a designed product. According to another technique, assembly and disassembly simulations are executed based on product design information and assembly and disassembly information; and evaluation is executed for assembly and disassembly properties. According to yet another technique, a part currently disassembled in the state where a product is midway in disassembling thereof is moved by a distance to be moved next that corresponds to the most closest distance between the currently disassembled part and the remaining parts at the present time point during the disassembling; and determination is made for each of the most closest distance and occurrence of an interference for the state after the currently disassembled part is moved (see, e.g., Japanese Laid-Open Patent Publication Nos. 2008-46924, 2005-275945, 2001-353631, H7-311792, and H10-312208).

However, according to the conventional techniques, when the assembly sequence of a product is determined by a user, to change the position of a part in the assembly sequence, the user performs multiple operations and in making a single change, a drag and drop operation and a cut and paste operation are performed. Thus, the user performs numerous operations.

SUMMARY

According to an aspect of an embodiment, an assembly sequence generating apparatus includes a computer configured to control a display unit to display a 3-D model; set, when parts included in the 3-D model displayed on the display unit are sequentially selected, the selected parts to not be displayed; and store to a memory unit, a reverse sequence of a sequence of the selection of the parts as an assembly sequence of the 3-D model.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A and 1B are explanatory diagrams of an example of operation of an assembly sequence generating apparatus according to an embodiment;

FIG. 2 is a block diagram of a hardware configuration of the assembly sequence generating apparatus according to the embodiment;

FIGS. 7A1, 7A2, 7B, 7C1, and 7C2 are explanatory diagrams of an example of an association for fastening parts;

FIG. 8 is an explanatory diagram of an example where a fastening part is caused to not be displayed after fastening part association is executed;

FIGS. 10A, 10B1, 10B2, and 10C are explanatory diagrams of an example of calculation of the degree of ease of disassembly;

FIG. 11 is an explanatory diagram of an example of sorting of parts;

DESCRIPTION OF EMBODIMENTS

Figure 3:
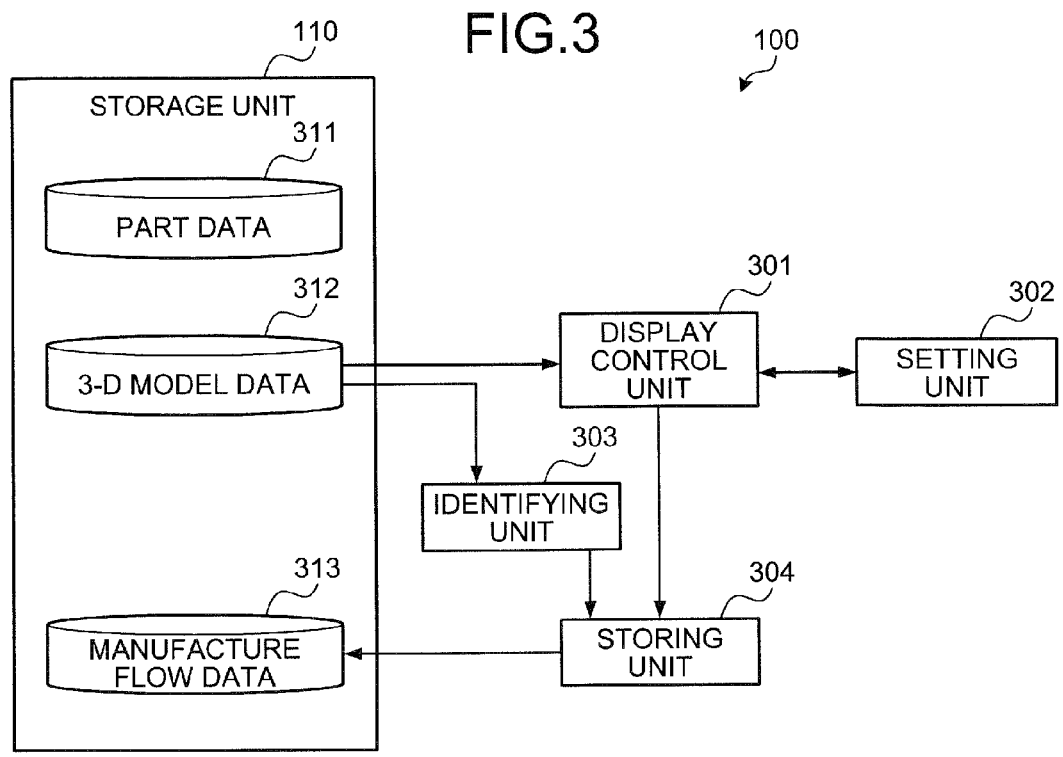
FIG. 3 is a block diagram of an example of functional configuration of the assembly sequence generating apparatus.

Embodiments will be described in detail with reference to the accompanying renderings.

FIGS. 1A and 1B are explanatory diagrams of an example of operation of an assembly sequence generating apparatus according to an embodiment. The assembly sequence generating apparatus 100 according to the embodiment is a computer that aids generation of an assembly sequence of a product. When a worker and a manufacturing apparatus assemble a product from plural parts, the worker and the apparatus assemble the product based on a sequence generated by the assembly sequence generating apparatus 100. It is assumed that the product is formed by two or more parts. The product can be, for example, a mechanical product such as a personal computer (PC), a server, a portable information terminal, a car, or a home appliance; etc.

When a reliable assembly sequence is generated, the apparatus executing the CAD displays a manufacture flow representing the assembly sequence of the product; accepts an operation of the user of the apparatus executing the CAD; and changes the position of a part in the manufacture flow for assembly; and thereby generates the assembly sequence of the product. For example, the following two operations are present as the operations to change the position of the part in the assembly sequence.

The first operation is a drag and drop operation of dragging on the screen the part whose position is to be changed and dropping the part at a target position. In the drag and drop operation, two operations of dragging and dropping are executed to set the position of a single part in the assembly sequence. The second operation is a cut and paste operation of displaying a context menu for the part whose position is to be changed, selecting "cut" from the menu, displaying the context menu at the position corresponding to the target position in assembly sequence, selecting "paste" from the menu, and pasting the part whose position is to be changed. In the cut and paste operation, four operations of displaying a menu, selecting "cut", displaying the menu, and selecting "paste" are executed to set the position of a single part.

In a case where an assembly sequence is generated for an intended product using either one of the two operations, representing the number of parts as "n", the user executes operations on the order of O(2n) when the drag and drop operation is used. The user executes operations on the order of O(4n) when the cut and paste operation is used. In this manner, when the number of parts is great, the plural operations occur to make one change and therefore, the operation amount is increased for the user. When the number of parts is great, some parts cannot be included on the screen for display and therefore, the apparatus executing the CAD scrolls the displayed content on the screen consequent to an operation of the user to display the target position. Therefore, the amount operations performed by the user further increases.

To facilitate reduction of the operation amount of the user in a state where the user can easily grasp the state of the disassembly of the product, the assembly sequence generating apparatus 100 sequentially causes the parts selected by the user to not be displayed, stores therein the selection sequence, and determines that the reverse sequence of the selection sequence is the assembly sequence of the product. Thereby, the assembly sequence of the product can be generated using the assembly sequence generating apparatus 100 by merely repeating the clicking operation. Therefore, the operation amount of the user is reduced in the determination of the assembly sequence of the product.

The assembly sequence generating apparatus 100 depicted in FIG. 1A displays on a display unit 102 a 3-D model 101 formed by parts Part_1, Part_2, Part_3, Part_4, and Part_5. The 3-D model 101 is a model simulating a product. It is assumed that, in this state, a user of the assembly sequence generating apparatus 100 clicks a mouse, whereby the part Part_4 is selected.

FIG. 1B depicts a state of the assembly sequence generating apparatus 100 after the part Part_4 is selected. The assembly sequence generating apparatus 100 causes the selected part Part_4 to not be displayed; stores identification information of the part Part_4 to a storage unit 110; each time a part is selected by the user, sets the selected part to not be displayed; stores the identification information of the selected part to the storage unit 110; and stores a reverse sequence of the selection sequence of the selected parts as the assembly sequence of the 3-D model 101.

Thus, with the assembly sequence generating apparatus 100, in a state where the user can easily grasp the state of the disassembly of the product, one operation to determine the assembly sequence of the product includes one clicking session and therefore, the operation amount of the user is reduced. In this embodiment, concerning the reduction of the operation amount, for example, representing the number of parts as "n", one operation of one clicking session of the mouse alone is executed to set the position of a single part in the assembly sequence. Therefore, the assembly sequence generating apparatus 100 performs reiteration on the order of O(n) to generate the assembly sequence of the intended product and therefore, can generate the assembly sequence of the product with a smaller amount of operations than when the drag and drop operation and the cut and paste operation are used. The details of the assembly sequence generating apparatus 100 will be described with reference to FIGS. 2 to 18.

FIG. 2 is a block diagram of a hardware configuration of the assembly sequence generating apparatus according to the embodiment. As depicted in FIG. 2, the assembly sequence generating apparatus 100 includes a central processing unit (CPU) 201, a read-only memory (ROM) 202, a random access memory (RAM) 203, a disk drive 204, a disk 205, a communication interface (I/F) 206, a display 207, a keyboard 208, a mouse 209, respectively connected by a bus 210. The display 207 corresponds to the display unit described with reference to FIGS. 1A and 1B, and the RAM 203 and the disk 205 correspond to the storage unit 110 described with reference to FIGS. 1A and 1B.

The CPU 201 governs overall control of the assembly sequence generating apparatus 100. The ROM 202 is non-volatile memory and stores programs such as a boot program. The RAM 203 is volatile memory used as a work area of the CPU 201.

The disk drive 204, under the control of the CPU 201, controls the reading and writing of data with respect to the disk 205. A magnetic disk drive, an optical disk drive, a solid state drive, and the like may be adopted as the disk drive 204, for example. The disk 205 is non-volatile memory storing data written thereto under the control of the disk drive 204. For example, when the disk drive 204 is a magnetic disk drive, a magnetic disk may be adopted for the disk 205. When the disk drive 204 is an optical disk drive, an optical disk may be adopted for the disk 205. When the disk drive 204 is a solid state drive, semiconductor memory may be adopted as the disk 205.

The communication I/F 206 is a control device that administers an internal interface with a network 211 and controls the input and output of data with respect to external apparatuses. The communication I/F 206 is connected to the network 211 such as a local area network (LAN), a wide area network (WAN), and the Internet through a communication line and is connected to other apparatuses through the network 211. For example, a modem or a LAN adaptor may be employed as the communication I/F 206.

The display 207 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 207.

The keyboard 208 includes, for example, keys for inputting letters, numerals, and various instructions and performs the input of data. Alternatively, a touch-panel-type input pad or numeric keypad, etc. may be adopted. The mouse 209 is used to move the cursor, select a region, or move and change the size of windows. A track ball or a joy stick may be adopted provided each respectively has a function similar to a pointing device.

A functional configuration of the assembly sequence generating apparatus 100 will be described. FIG. 3 is a block diagram of an example of functional configuration of the assembly sequence generating apparatus. The assembly sequence generating apparatus 100 includes a display control unit 301, a setting unit 302, an identifying unit 303, and a storing unit 304. Functions of units from the display control unit 301 to the storing unit 304 forming a control unit, are implemented by executing on the CPU 201, programs stored in a storage device. The storage device is, for example, the ROM 202, the RAM 203, or the disk 205 depicted in FIG. 2. Functions of the units from the display control unit 301 to the storing unit 304 may be implemented by an execution of programs by another CPU through the communication interface 206.

The assembly sequence generating apparatus 100 can access the storage unit 110. The storage unit 110 is stored in the storage device such as the RAM 203 or the disk 205, and includes part data 311, 3-D model data 312, and manufacture flow data 313. The part data 311 includes for each part, information indicating the shape of the part whose sequence position is to be changed. The details of the part data 311 will be described later with reference to FIGS. 4A and 4B.

The 3-D model data 312 is data indicating the 3-D model that simulates the product using the part data 311. The details of the 3-D model data 312 will be described later with reference to FIG. 5. The 3-D model data 312 may include fastening parts. A fastening part is a part that fastens plural parts to each other. The fastening part is, for example, a bolt, a nut, and a washer. A part fastened by the fastening part is referred to as "fastened part".

The manufacture flow data 313 stores an assembly sequence of nodes that represents any one of the parts, an assembly formed by assembling some parts, and an assembly step to assemble a part. The details of the manufacture flow data 313 will be described later with reference to FIGS. 6A and 6B.

The display control unit 301 causes the display unit 102 to display the 3-D model. In the example depicted in FIGS. 1A and 1B, the display control unit 301 causes the display unit 102 to display the 3-D model 101.

When a part of the 3-D model is selected, the display control unit 301 may calculate a degree of ease of disassembly the part; and may cause the display unit 102 to display information that indicates the degree of ease of the disassembling according to the ease of the disassembling. Information indicating the degree of ease of disassembly a part will be described later with reference to FIGS. 9A, 9B and FIGS. 10A, 10B1, 10B2, and 10C.

When plural parts included in the 3-D model displayed on the display unit 102 are sequentially selected, the setting unit 302 sets the selected plural parts to not be displayed. The setting unit 302 may set in advance the fastening parts to not be displayed. The expression "in advance" used in this case refers to a stage before the user executes the assembly sequence of the product. For example, the setting unit 302 sets the fastening parts to not be displayed, immediately after the setting unit 302 reads the 3-D model data 312 and the manufacture flow data 313. The set information is stored in the RAM 203 or the disk 205.

In a case where a part is fastened with the 3-D model by a fastening part, when the part is selected, the identifying unit 303 identifies the part that fastens the part. For example, in a case where the user selects the part, when a bounding box encompassing the part and another bounding box encompassing another part included in the 3-D model intersect with each other, the identifying unit 303 identifies the other part as the part fastening the part. A "bounding box" refers to a cuboid whose faces are parallel to any one of X1, Y1, and Z1 axes covering the part whose assembly sequence position is to be changed. The X1, Y1, and Z1 axes are the axes of a local coordinate system for the part whose assembly sequence position is to be changed.

The storing unit 304 stores in the storage unit 110, a reverse sequence of the selection sequence of the plural parts, as the assembly sequence of the 3-D model. For example, the assemble sequence of the product is represented by the sequence of the nodes of the manufacture flow data 313.

The storing unit 304 may store the assembly sequence associating the part identified by the identifying unit 303 with the part fastening the part. It is assumed that, for example, the identifying unit 303 identifies the part Part_4 and a part SCR_01_01 that fastens the part Part_4. In this case, the storing unit 304 stores the assembly sequence such that the part SCR_01_01 is assembled immediately after the part Part_4.

Figure 4A:
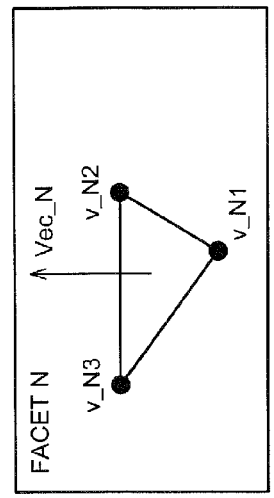
FIGS. 4A and 4B are explanatory diagrams of an example of the contents of the part data.
Figure 4B:
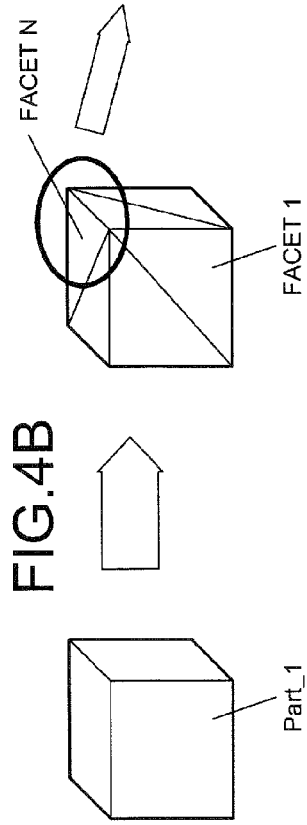

FIGS. 4A and 4B are explanatory diagrams of an example of the contents of the part data. The contents of the part data 311 will be described with reference to FIG. 4A and shape information included in the part data 311 will be described with reference to FIG. 4B. The part data 311 includes information indicating the shape of the part whose assembly sequence position is to be changed, for each part. The part data 311 depicted in FIG. 4A includes a record 401-1.

The part data 311 includes five fields for the part name, the origin coordinates of the part, the local coordinate system, color information, and the shape information. The part name field stores the name of the part whose assembly sequence position is to be changed. The part origin coordinates field stores position information of the part whose assembly sequence position is to be changed, in the global coordinate system. The local coordinate system field stores information indicating the direction of each of the axes of the local coordinate system. In this embodiment, a conversion matrix is stored that converts a global coordinate into a local coordinate by being multiplied by the global coordinate, as information indicating the direction of each of the axes of the local coordinate system. The color information field stores color information of the part whose assembly sequence position is to be changed. The color information is, for example, an RGB value. The shape information field stores the shape information indicating the shape of the part whose assembly sequence position is to be changed. In the embodiment, the shape information is formed using plural facets as the shape information. A "facet" is information to identify a micro flat surface. The facet will be described with reference to FIG. 4B.

As depicted in FIG. 4B, the part Part_1 is formed by facets 1 to N. One facet has coordinate information concerning three vertices and a normal vector of a micro flat surface formed by the three vertices. For example, the facet N has three vertices $v\_N1$, $v\_N2$, and $v\_N3$, and a normal vector Vec_N.

For example, the record 401-1 depicted in FIG. 4A depicts for the part Part_1 that the origin coordinate is P1 that is P1(xg, yg, zg); the conversion matrix is R1; the color information is (r1, g1, b1); and the part Part_1 has the facets 1 to N.

Figure 5:
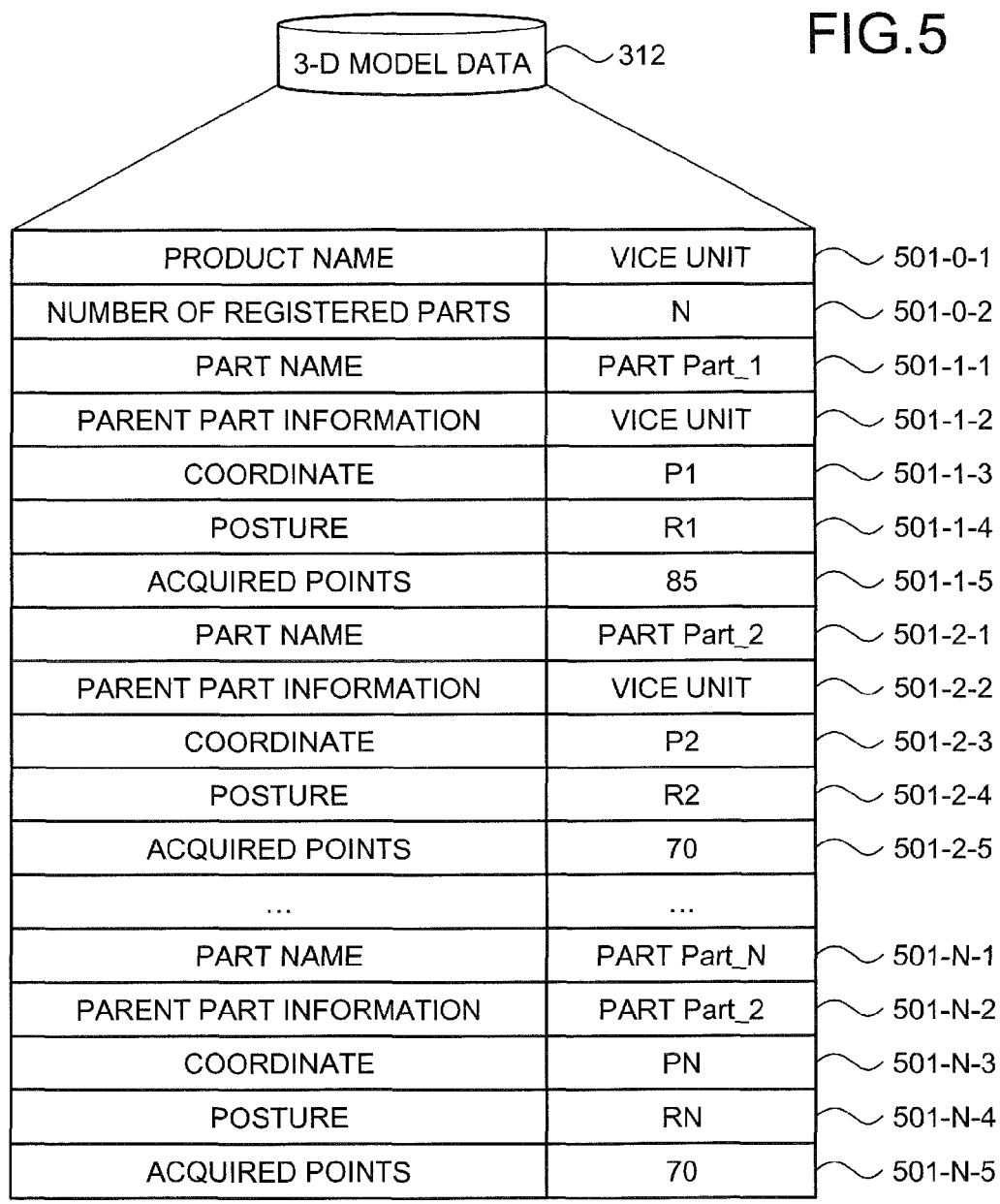
FIG. 5 is an explanatory diagram of an example of the contents of 3-D model data.

FIG. 5 is an explanatory diagram of an example of the contents of the 3-D model data. The 3-D model data 312 is the data indicating the 3-D model that simulates the product using the part data 311. The 3-D data depicted in FIG. 5 has records 501-0-1 to 501-N-5. The records 501-0-1 and 501-0-2 form a header portion concerning the entire 3-D model. The records 501-1-1 to 501-N-5 store in information concerning N parts included in the 3-D model. For example, the records 501-1-1 to 501-1-5 include information concerning the part Part_1 included in the 3-D model. The records 501-2-1 to 501-2-5 include information concerning the part Part_2 included in the 3-D model. The records 501-N-1 to 501-N-5 include information concerning the part Part_N included in the 3-D model.

The 3-D model 312 has two fields for the product name and the number of registered parts, as the header portion. The product name field stores the name of the product. The registered parts number field stores the number of parts included in the 3-D model.

The 3-D model data 312 includes five fields for the part name, the parent part information, the coordinates, the posture, and acquired points, as the information concerning the parts. The part name field stores the name of a part included in the 3-D model data. The record whose part name field stores the name of a part among the records stored in the part data 311 is information corresponding to the part. The parent part information field stores the name of the parent name to which the part belongs. The assembly sequence generating apparatus 100 forms a hierarchy of the manufacture flow screen using the parent part information field. When no parent part is present, the parent part information field has the name stored in the product name field, stored therein.

The coordinate field has relative coordinates of a part relative to the origin in the local coordinate system of the parent part thereof, stored therein. The posture field has a matrix representing a relative posture of a part from the posture of the parent part thereof, stored therein. The acquired point field has a value representing the degree of ease of disassembly a part, stored therein.

For example, the record 501-0-1 indicates that the name of the product simulated by the 3-D model is "vice unit"; the record 501-0-2 indicates that the number of parts included in the 3-D model data 312 is N; and the records 501-1-1 to 501-1-5 indicate that the name of a first part is the part Part_1, that the coordinate of the first part is P1, that a matrix representing the posture of the first part is R1, and that the degree of ease of disassembly is 85 marks.

Figure 6A:
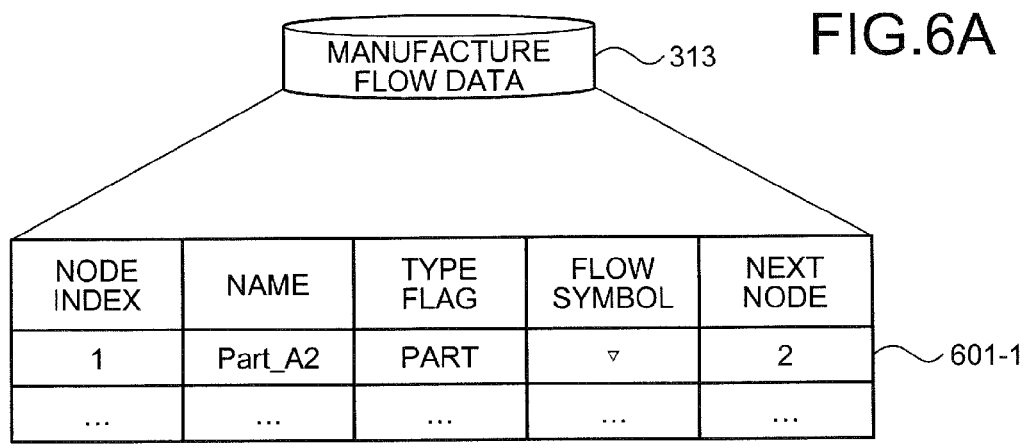
FIGS. 6A and 6B are explanatory diagrams of an example of the contents of manufacture flow data.
Figure 6B:
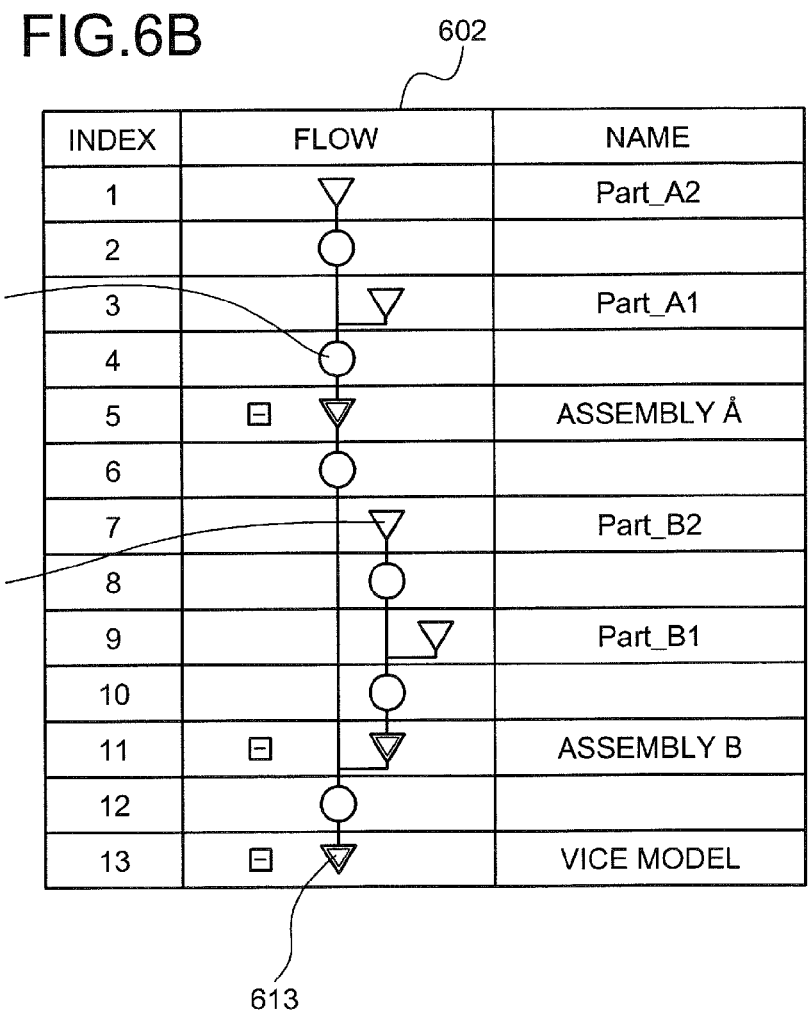

FIGS. 6A and 6B are explanatory diagrams of an example of the contents of the manufacture flow data. FIG. 6A depicts the contents of the manufacture flow data 313. FIG. 6B depicts an example of a manufacture flow screen showing the assembly sequence. The manufacture flow data 313 includes for each node, information that indicates any among a part, an assembly formed by assembling some parts, and an assembly step to assemble a part. The manufacture flow data 313 depicted in FIG. 6A includes a node 601-1.

The manufacture flow data 313 includes five fields for the node index, the name, the type flag, the flow symbol, and the next node index. The node index field stores the order of nodes. The name field stores the part name, the assembly name, or the step name. The type flag field stores the type of node to be handled. For example, the type flag field stores any one among a "part" identifier indicating the part, an "assembly" identifier indicating the assembly, and an "assembly step" identifier indicating an assembly step. The flow symbol field stores an icon to identify the type of the node to be handled. The icon will be described with reference to FIG. 6B. The next node index field stores the value of the node index field of the next node. The next node index field for the last node in the manufacture flow data 313 has "NULL" stored therein that represents that the node is the last node.

For example, the node 601-1 indicates that the node is the first node, that the node has a part whose name is "Part_A2", and that the next node of the node is the second node.

In FIG. 6B, a manufacture flow screen 602 is an example of screen showing the assembly sequence of the product using the manufacture flow data 313. The manufacture flow screen 602 is divided into three display areas for the index, the flow, and the name. The index field shows the value of the node index field. The name field shows the name of a part, an assembly, or an assembly step. The manufacture flow screen 602 depicted in FIG. 6B shows the sequence for the first to thirteenth parts or assemblies to be assembled and the assembly steps therefor as the assembly sequence of the product.

The icon displayed in the flow field will be described. An icon 611 represented by a circle represents a step. An icon 612 represented by a downward triangle represents a part. An icon 613 represented by a downward double triangle represents an assembly assembled using plural parts.

FIGS. 7A1, 7A2, 7B, 7C1, and 7C2 are explanatory diagrams of an example of an association for fastening parts. A process to associate a fastening part and a part different from the fastening part of the plural parts included in the 3-D model will be described with reference to FIGS. 7A1, 7A2, 7B, 7C1, and 7C2. FIGS. 7A1 and 7A2 depict specific examples of the fastening parts included in the 3-D model. As depicted in FIGS. 7A1 and 7A2, when the development engineer registers the fastening parts into the part data 311, the development engineer designates the part names of the fastening parts such that the key words "SCR" and "M4" are included that represent that the parts are the fastening parts. The assembly sequence generating apparatus 100 identifies as the fastening parts the parts whose part names include the key words representing the fastening parts, of the plural parts included in the 3-D model.

FIG. 7B depicts an example where such items are displayed as: the identified fastening parts; parts that are likely to be fastened parts, fastened by the fastening parts; and a bounding box covering these parts. For example, FIG. 7B depicts parts SCR_01_01 and SCR_01_02 identified as the fastening parts, and the parts Part_4 and Part_5 that are likely to be fastened parts. The assembly sequence generating apparatus 100 determines whether the parts Part_4 and Part_5 are fastened by the parts SCR_01_01 and SCR_01_02, based on whether the bounding boxes covering these parts intersect with each other.

FIG. 7B depicts an example where the bounding boxes are displayed that cover the parts. As depicted in FIG. 7B, the part SCR_01_01 intersects the parts Part_4 and Part_5 and therefore, the assembly sequence generating apparatus 100 identifies the parts Part_4 and Part_5 as the fastened parts that are fastened by the part SCR_01_01. The assembly sequence generating apparatus 100 stores therein the parts SCR_01_01, Part_4, and Part_5 associating the parts Part_4 and Part_5 with the part SCR_01_01. An example of stored contents is depicted in FIG. 7C1 as a record 701-1.

Similarly, the part SCR_01_02 intersects the parts Part_4 and Part_5 and therefore, the assembly sequence generating apparatus 100 identifies the parts Part_4 and Part_5 as the fastened parts that are fastened by the part SCR_01_02. The assembly sequence generating apparatus 100 stores therein the parts SCR_01_02, Part_4, and Part_5 associating the parts Part_4 and Part_5 with the part SCR_01_02. An example of the stored contents is depicted in FIG. 7C2 as a record 701-2.

FIG. 7C1 depicts a fastening part list 701 and FIG. 7C2 depicts a fastening part association list 702 that show the associations between the fastening parts and the fastened parts. The fastening part list 701 includes two fields for the fastening part and the fastened parts. To facilitate the search using "fastened part", the assembly sequence generating apparatus 100 refers to the fastening part list 701 and generates the fastening part association list 702. The fastening part association list 702 includes two fields for the fastened part and the associated fastening part. The fastened part field stores the name that is stored in the fastened part field of the fastening part list 701. The associated fastening part field stores the fastening part that is associated with the fastened part stored in the fastened part field of the fastening part association list 702.

FIG. 8 is an explanatory diagram of an example where the fastening part is caused to not be displayed after the fastening part association is executed. FIG. 8 depicts an example where the fastening parts are caused to not be displayed using the fastening part association list 702 acquired after the association is executed. In (A) of FIG. 8, the parts SCR_01_01 and SCR_01_02 that are the fastening parts are displayed. In (B) of FIG. 8, the parts SCR_01_01 and SCR_01_02, which are the fastening parts, are caused to not be displayed. Thus, when the user of the assembly sequence generating apparatus 100 determines the assembly sequence of the product based on the sequence of the selection, the number of parts displayed on the assembly sequence generating apparatus 100 becomes small and the operation amount is reduced for the user.

A process of responding to a mouse operation will be described with reference to FIGS. 9A to 11. A process executed when the mouse cursor enters a part of the 3-D model will be described with reference to FIGS. 9A, 9B and FIGS. 10A, 10B1, 10B2, and 10C. The case where the button of the mouse is pressed down for a part of the 3-D model will be described with reference to FIG. 11.

Figure 9A:
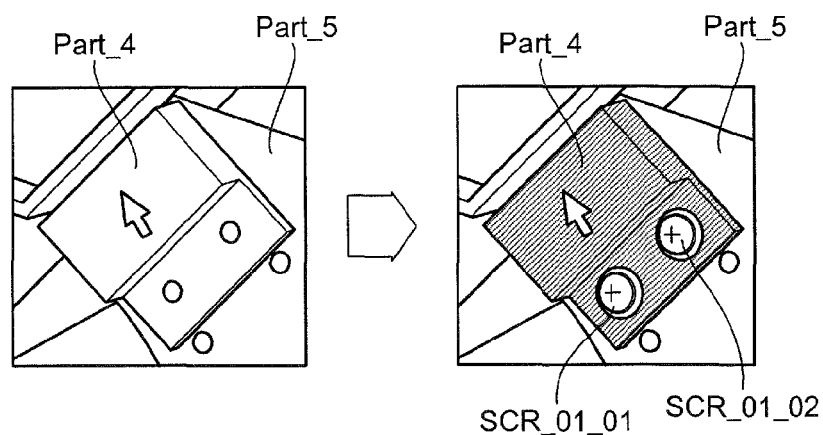
FIGS. 9A and 9B are explanatory diagrams of an example of pre-highlighting of a 3-D model.
Figure 9B:
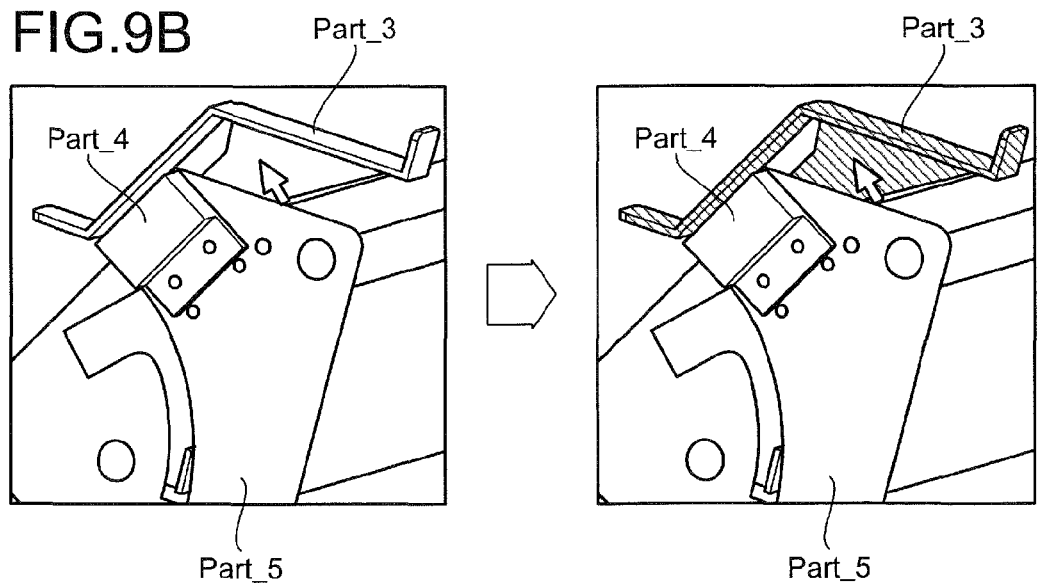

FIGS. 9A and 9B are explanatory diagram of an example of pre-highlighting of the 3-D model. When the mouse cursor enters a part of the 3-D model, the assembly sequence generating apparatus 100 executes a process of displaying information indicating the degree of ease of disassembly, as a pre-highlight process. The entrance of the mouse cursor into a part of the 3-D model will be expressed as "to execute mouse-over for a part". FIG. 9A depicts an example of the pre-highlight process executed when the mouse-over is executed for the part Part_4. FIG. 9B depicts an example of the pre-highlight process executed when the mouse-over is executed for the part_3.

The information indicating the degree of ease of disassembly may indicate the degree of ease of disassembly using the color of a part, or may indicate the degree of ease of disassembly using the thickness and the length of an arrow by displaying the arrow on the part. In this embodiment, the degree of ease of disassembly is indicated using the color of the part. For example, when the color of a part is changed to blue, this indicates that the degree of ease of disassembly is high and that the part is easy to be disassembled and, when the color of a part is changed to red, this indicates that the degree of ease of disassembly is low and that the part is difficult to be disassembled when other parts are not disassembled in advance. When the color of a part is changed to yellow, this indicates a neutral state where the part is not easy and not difficult to be disassembled.

In FIG. 9A, the assemble sequence generating apparatus 100 determines that the part Part_4 is easy to be disassembled and displays the part Part_4 whose color is changed to blue. In FIG. 9B, the assemble sequence generating apparatus 100 determines that the part Part_3 is difficult to be disassembled and displays the part Part_3 in red. In the examples depicted in FIGS. 9A and 9B, blue is represented by a thick hatch and red is represented by a thin hatch. An example of calculation of the degree of ease of disassembly will be described with reference to FIGS. 10A, 10B1, 10B2, and 10C.

FIGS. 10A, 10B1, 10B2, and 10C are explanatory diagrams of an example of calculation of the degree of ease of disassembly. The assembly sequence generating apparatus 100 executes the pre-highlight process for a part when the mouse-over is executed for the part. FIGS. 10A, 10B1, 10B2, and 10C depict an example where the degree of ease of disassembly is calculated for the part Part_4 and the information is generated that indicates the degree of ease of disassembly.

The assembly sequence generating apparatus 100 identifies a face that has thereon the mouse cursor of the part Part_4 and identifies the normal vector of the face with the mouse cursor. The normal vector of a face can be identified by, for example, identifying a facet of the part data 311 and acquiring the normal vector of the identified facet. In the example of FIG. 10A, it is assumed that a normal vector 1002 of the face having thereon the mouse cursor 1001 is in a +X1 direction.

The assembly sequence generating apparatus 100 projects the part Part_4 from the identified normal vector onto a rendering area of a specific size, at a display magnification that enables the rendering area to accommodate the part Part_4. For the projection, the assembly sequence generating apparatus 100 determines that the color of the part Part_4 is white and that of the background is black; causes the other parts to not be displayed; and executes the projection. The specific size is designated by the development engineer. The image projected onto the rendering area is depicted in FIG. 10B1 as an image D1. In FIG. 10B1, the image has a specific size and has 100 [pixel] vertically and 100 [pixel] horizontally.

The assembly sequence generating apparatus 100 projects the part Part_4 from the identified normal vector onto the rendering area of the specific size, at the display magnification that enables the rendering area to accommodate the part Part_4. For the projection, the assembly sequence generating apparatus 100: determines that the color of the part Part_4 is white, that the other parts are displayed and the color thereof is black, and that the color of the background is black; and executes the projection onto the rendering area. The image projected onto the rendering area is depicted in FIG. 10B2 as an image D2.

As depicted in FIG. 10C, the assembly sequence generating apparatus 100 calculates the degree of ease of disassembly, using the image for a case where the other parts are displayed and the image for a case where the other parts are caused to not be displayed; and generates the information indicating the degree of ease of disassembly. For example, the assembly sequence generating apparatus 100 calculates the degree of ease of disassembly according to Equation (1) below.

Degree of ease of disassembly=the number of white pixels used when the other parts are displayed/ the number of white pixels used when the other parts are caused to not be displayed*100 (1)

In the example in FIGS. 10B1 and 10B2, it is assumed that the number of white pixels of the image D1 is 800 and the number of white pixels of the image D2 is 780. The assembly sequence generating apparatus 100 calculates the degree of ease of disassembly using Eq. (1) as below.

The degree of ease of disassembly=the number of white pixels of D2/the number of white pixels of D1*100↔Degree of ease of disassembly780/800*100=97.5

The assembly sequence generating apparatus 100 generates the information indicating the degree of ease of disassembly based on the calculation result. In this embodiment, the color of the part is set corresponding to the value of the degree of ease of disassembly. A table 1003 shows the colors of parts that correspond to the values of the degrees of easiness of disassembly.

When the value of the degree of ease of disassembly is between 90 and 100, the assembly sequence generating apparatus 100 causes the user to recognize that a part is easy to be disassembled by displaying the part in blue, as information indicating the degree of ease of disassembly. When the value of the degree of ease of disassembly is between 80 and 89, the assembly sequence generating apparatus 100 causes the user to recognize that a part is not easy and not difficult to be disassembled, by displaying the part in yellow, as information indicating the degree of ease of disassembly. When the value of the degree of ease of disassembly is equal to or lower than 79, the assembly sequence generating apparatus 100 causes the user to recognize that a part is difficult to be disassembled, by displaying the part in red, as the information indicating the degree of ease of disassembly. When the value of the degree of ease of disassembly is equal to or lower than 79, the assembly sequence generating apparatus 100 may display an alert message that notifies that the part is difficult to be disassembled.

It has been described that the information indicating the degree of ease of disassembly may be the length or the thickness of an arrow. In the case where the information indicating the degree of ease of disassembly is the length of an arrow, for example, when the value of the degree of ease of disassembly is between 90 and 100, the assembly sequence generating apparatus 100 may display a long arrow on the part and, when the value of the degree of ease of disassembly is 79 or less, may display a short arrow thereon.

The assembly sequence generating apparatus 100 may also display plural arrows. For example, the assembly sequence generating apparatus 100 may calculate the degrees of easiness of disassembly observed from plural directions such as the direction of the normal vector of the face having the mouse cursor present therein, and the direction in parallel to or vertical to the normal vector; and may display an arrow that corresponds to the degree of ease of disassembly and that is oriented in the above direction. In the example depicted in FIGS. 10A, 10B1, 10B2, and 10C, the assemble sequence generating apparatus 100 calculates the degree of ease of disassembly observed from the +X1 direction that is the direction of the normal vector of the face having the mouse cursor present therein, the −X1 direction in parallel to the +X1 direction, the +Y1 direction vertical to the +X1 direction, the −Y1 direction, +Z1 direction, and the −Z1 direction. The assembly sequence generating apparatus 100 displays arrows that correspond to the degrees of easiness of disassembly and that are oriented to the +X1 direction, −X1 direction, the +Y1 direction, −Y1 direction, the +Z1 direction, and the −Z1 direction. Thereby, the user can easily recognize in which direction the part is easiest to be disassembled.

FIG. 11 is an explanatory diagram of an example of sorting of parts. FIG. 11 depicts an example of parts sorting that is executed when the user presses down the button of the mouse while the cursor is on a model. A manufacture flow screen 1101 shows the state before the pressing down of the button of the mouse. A manufacture flow screen 1102 shows the state after the pressing down of the button of the mouse. On the manufacture flow screens 1101 and 1102, the upward order of the nodes represents the disassembly sequence and the downward order of the nodes represents the assembly sequence. It is assumed that, with the assembly sequence generating apparatus 100, the button of the mouse is pressed down for the part Part_5 of the 3-D model in the state displayed on the manufacture flow screen 1101.

In this case, the assembly sequence generating apparatus 100 sets the disassembly sequence position for the part Part_5 that is to be disassembled to be subsequent to that of an assembly unit; and sets the disassembly sequence positions for the fastening parts SCR_01_01 and SCR_01_02 that are associated with the part Part_5 and to be disassembled, to be immediately before that of the part Part_5. The screen after the setting is the manufacture flow screen 1102. Thus, when the assembly sequence generating apparatus 100 generates the assembly sequence based on the selection sequence of the parts, the assembly sequence generating apparatus 100 does not need to select any fastening part and therefore, can generate the assembly sequence with a small amount of operations.

Flowcharts to execute the operations described with reference to FIGS. 6A to 11 will be described with reference to FIGS. 12 to 18.

Figure 12:
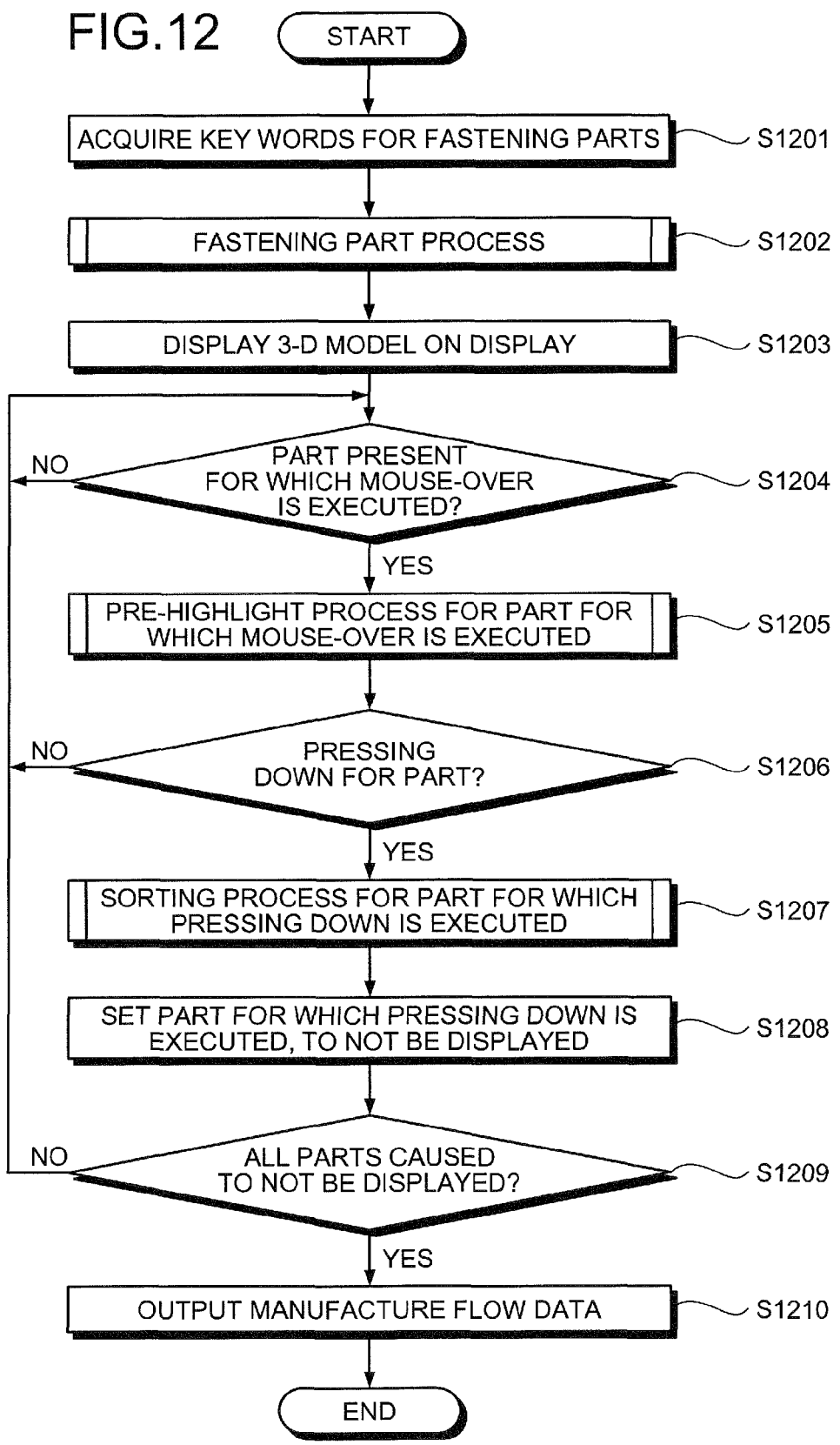
FIG. 12 is a flowchart of an example of a procedure for an assembly sequence generation process.

FIG. 12 is a flowchart of an example of a procedure for an assembly sequence generation process. The assembly sequence generation process is a process of generating the assembly sequence of the product using selection of the parts by the user. The assembly sequence generating apparatus 100 acquires key words for the fastening parts (step S1201) and executes a fastening part process (step S1202). The details of the fastening part process will be described later with reference to FIG. 13. The assembly sequence generating apparatus 100 displays the 3-D model on the display 207 (step S1203) and determines whether any part is present for which mouse-over is executed (step S1204). If the assembly sequence generating apparatus 100 determines that no part is present for which mouse-over is executed (step S1204: NO), the assembly sequence generating apparatus 100 executes the process at step S1204 after a specific time period elapses.

If the assembly sequence generating apparatus 100 determines that a part is present for which mouse-over is executed (step S1204: YES), the assembly sequence generating apparatus 100 executes the pre-highlight process for the part for which mouse-over has been executed (step S1205). The details of the pre-highlight process will be described later with reference to FIG. 15. The assembly sequence generating apparatus 100 determines whether the user executes the pressing down for any part (step SS1206). If the assembly sequence generating apparatus 100 determines that the user does not execute the pressing down for any part (step SS1206: NO), the assembly sequence generating apparatus 100 progresses to the process at step S1204. If the assembly sequence generating apparatus 100 determines that the user executes the pressing down for a part (step SS1206: YES), the assembly sequence generating apparatus 100 executes a sorting process for the part for which the pressing down is executed (step S1207). The details of the sorting process will be described later with reference to FIG. 18.

The assembly sequence generating apparatus 100 sets the part for which the pressing down is executed, to not be displayed (step S1208) and determines whether none the parts are to be displayed (step S1209). If the assembly sequence generating apparatus 100 determines that some of the parts are to be displayed (step S1209: NO), the assembly sequence generating apparatus 100 progresses to the process at step S1204. If the assembly sequence generating apparatus 100 determines that none of the parts are to be displayed (step S1209: YES), the assembly sequence generating apparatus 100 outputs the manufacture flow data 313 (step S1210). After the process at step S1210 comes to an end, the assembly sequence generation process to come to an end. The assembly sequence generating apparatus 100 can generate the assembly sequence of the product with a small operation amount for the user by executing the assembly sequence generation process. The worker and the manufacturing apparatus for the work manufacture the product according to the output manufacture flow data 313.

Figure 13:
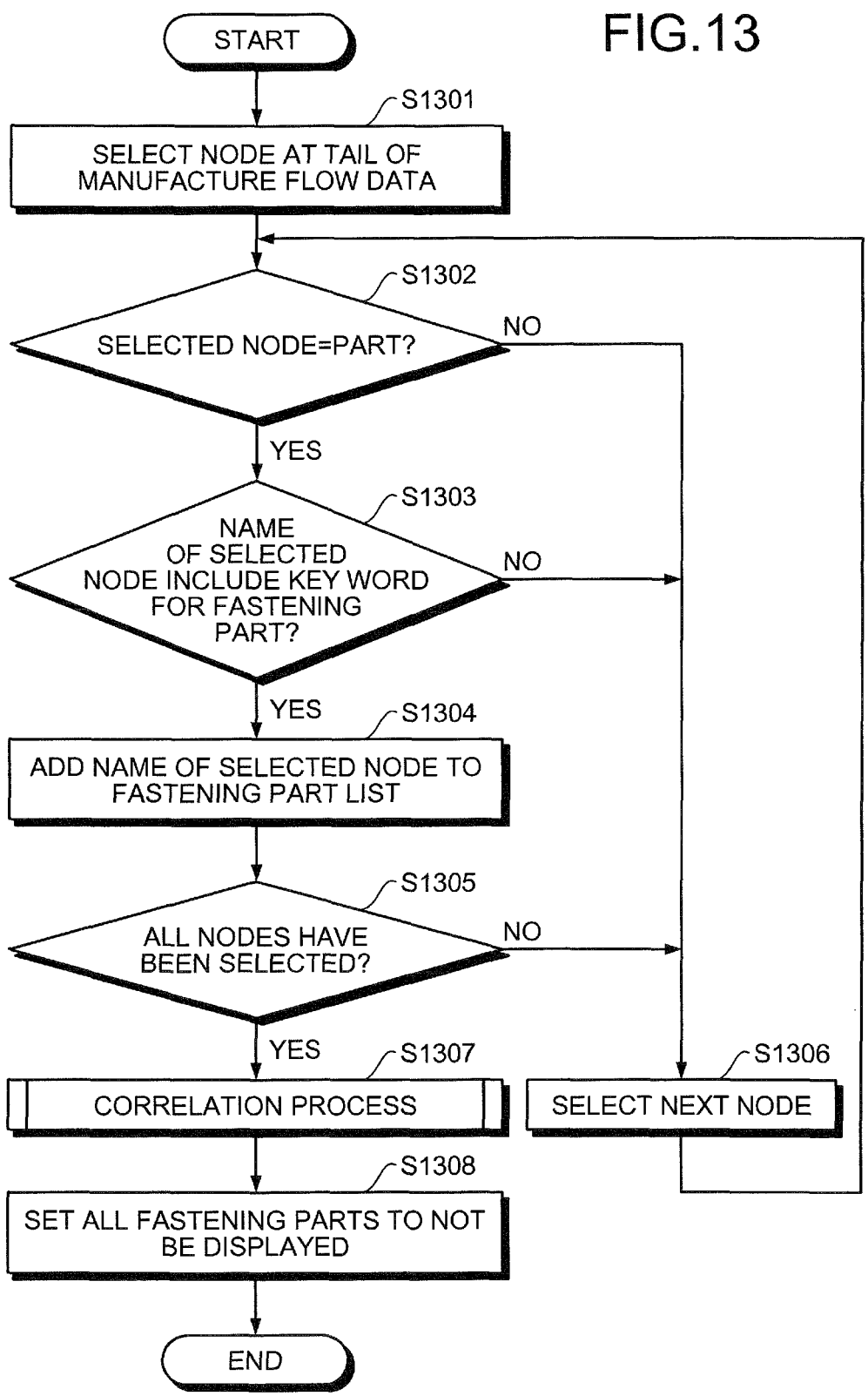
FIG. 13 is a flowchart of an example of a procedure for a fastening part process.

FIG. 13 is a flowchart of an example of a procedure for the fastening part process. The fastening part process is a process concerning the fastening parts of all the parts. The assembly sequence generating apparatus 100 selects the node at the tail of the manufacture flow data 313 (step S1301), refers to the type flag field, and determines whether the selected node is a part (step S1302). When the assembly sequence generating apparatus 100 determines that the selected node is a part (step S1302: YES), the assembly sequence generating apparatus 100 determines whether the name of the selected node includes a key word for a fastening part (step S1303).

If the assembly sequence generating apparatus 100 determines that the name of the selected node includes a key word for a fastening part (step S1303: YES), the assembly sequence generating apparatus 100 adds the name of the selected node to the fastening part list (step S1304) and determines whether all the nodes have been selected (step S1305). If the assembly sequence generating apparatus 100 determines that the selected node is not a part (step S1302: NO), if the assembly sequence generating apparatus 100 determines that the name of the selected node includes no key word for any fastening part (step S1303: NO), or if the assembly sequence generating apparatus 100 determines that some unselected nodes are present (step S1305: NO), the assembly sequence generating apparatus 100 selects the next node (step S1306). After the execution of the process at step S1306 comes to an end, the assembly sequence generating apparatus 100 progresses to the process at step S1302.

If the assembly sequence generating apparatus 100 determines that all the nodes have been selected (step S1305: YES), the assembly sequence generating apparatus 100 executes a fastening part association process (step S1307). The details of the fastening part association process will be described later with reference to FIG. 14. The assembly sequence generating apparatus 100 sets all the fastening parts to not be displayed (step S1308). After the process at step S1308 comes to an end, the assembly sequence generating apparatus 100 causes the fastening part process to come to an end. By executing the fastening part process, the assembly sequence generating apparatus 100 sets the fastening parts to not be displayed before the user generates the assembly sequence of the product by making selections and therefore, the number of parts selected by the user is reduced, whereby the amount of operations can be reduced for the user.

Figure 14:
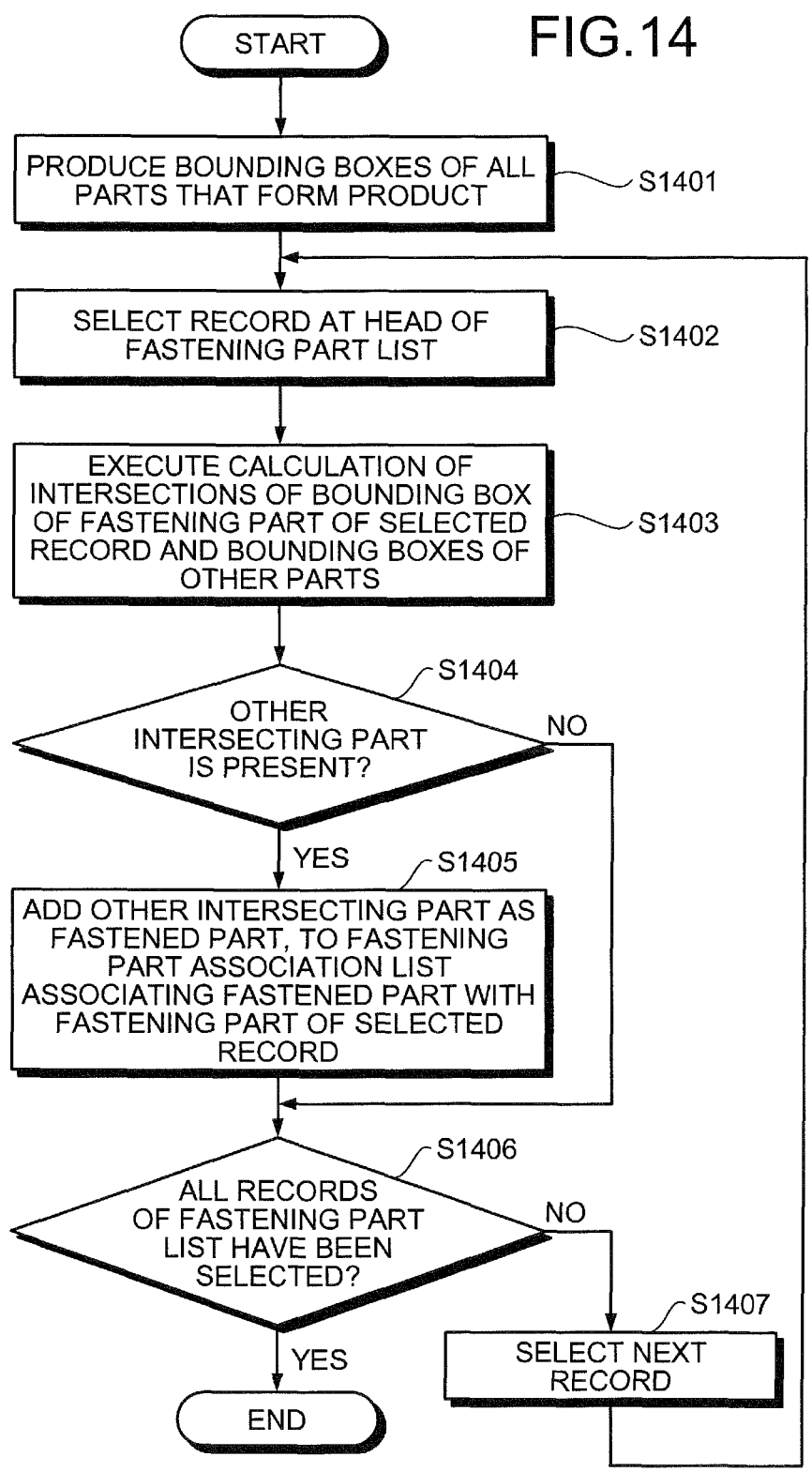
FIG. 14 is a flowchart of an example of a procedure of the fastening part association process.

FIG. 14 is a flowchart of an example of a procedure of the fastening part association process. The fastening part association process is a process of associating the fastening parts with the fastened parts that are fastened by the fastening parts. The assembly sequence generating apparatus 100 generates bounding boxes for each of the parts that form the product (step S1401), selects the record at the head from the fastening part list 701 (step S1402), executes calculation of the intersections of the bounding box of the fastening part of the selected record and the bounding boxes of the other parts (step S1403), and determines whether any intersecting part is present based on the calculation of the intersections (step S1404).

If the assembly sequence generating apparatus 100 determines that another intersecting part is present (step S1404: YES), the assembly sequence generating apparatus 100 adds the other intersecting part as a fastened part, to the fastening part association list 702, associating the fastened part with the fastening part of the selected record (step S1405). After the process at step S1405 is executed or when the assembly sequence generating apparatus 100 determines that no other intersecting part is present (step S1404: NO), the assembly sequence generating apparatus 100 determines whether the assembly sequence generating apparatus 100 has selected all the records of the fastening part list 701 (step S1406). If the assembly sequence generating apparatus 100 determines that some of the records remain unselected (step S1406: NO), the assembly sequence generating apparatus 100 selects the next record (step S1407). After the process at step S1407 comes to an end, the assemble sequence generating apparatus 100 progresses to the process at step S1402. If the assembly sequence generating apparatus 100 determines that the assembly sequence generating apparatus 100 has selected all the records (step S1406: YES), the assembly sequence generating apparatus 100 causes the fastening part association process to come to an end. The assembly sequence generating apparatus 100 can identify the fastened part that is fastened by the fastening part, by executing the fastening part association process.

Figure 15:
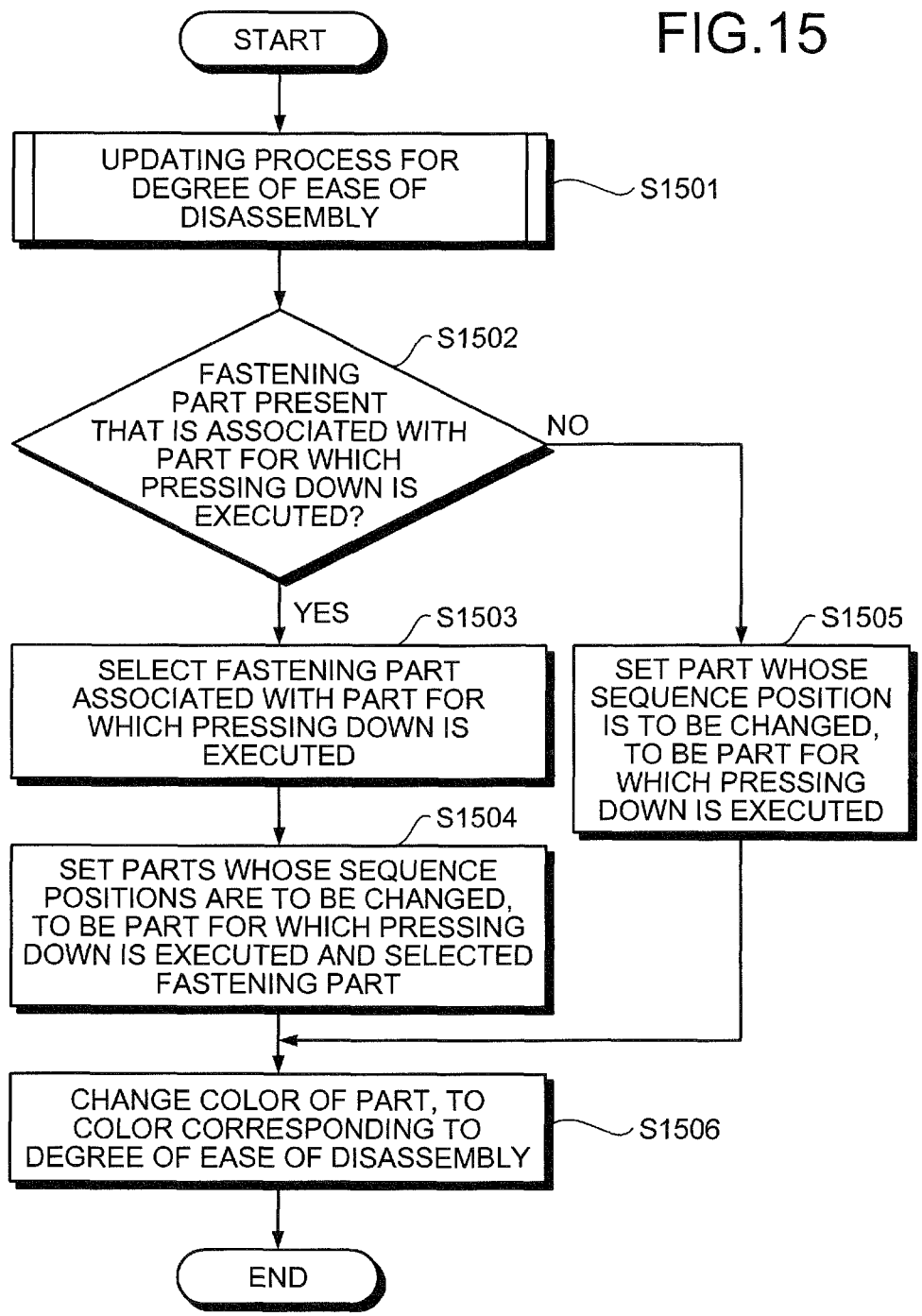
FIG. 15 is a flowchart of an example of a procedure of a pre-highlight process.

FIG. 15 is a flowchart of an example of a procedure of the pre-highlight process. The pre-highlight process is a process of displaying information indicating the degree of ease of disassembly, that is execute when mouse-over is executed.

The assembly sequence generating apparatus 100 executes an updating process for the degree of ease of disassembly (step S1501). The details of the updating process for the degree of ease of disassembly will be described later with reference to FIG. 16. The assemble sequence generating apparatus 100 refers to the fastening part association list 702 and determines whether a fastening part is present that is associated with the part for which the pressing down is executed (step S1502). If the assembly sequence generating apparatus 100 determines that a fastening part is present that is associated with the part for which the pressing down is executed (step S1502: YES), the assembly sequence generating apparatus 100 selects the fastening part associated with the part for which the pressing down is executed (step S1503). The assembly sequence generating apparatus 100 sets the parts whose sequence positions are to be changed, to be the part for which the pressing down is executed and the selected fastening part (step S1504). When the assembly sequence generating apparatus 100 determines that no fastening part is present that is associated with the part for which the pressing down is executed (step S1502: NO), the assembly sequence generating apparatus 100 sets the part whose sequence position is to be changed, to be the part for which the pressing down is executed (step S1505).

After the process at step S1504 or S1505 comes to an end, the assembly sequence generating apparatus 100 changes the color of the part whose sequence position is to be changed, to a color corresponding to the degree of ease of disassembly (step S1506). After the process at step S1506 comes to an end, the assembly sequence generating apparatus 100 causes the pre-highlight process to come to an end. The assembly sequence generating apparatus 100 can present in an intuitive manner the degree of ease of disassembly to the user by executing the pre-highlight process.

Figure 16:
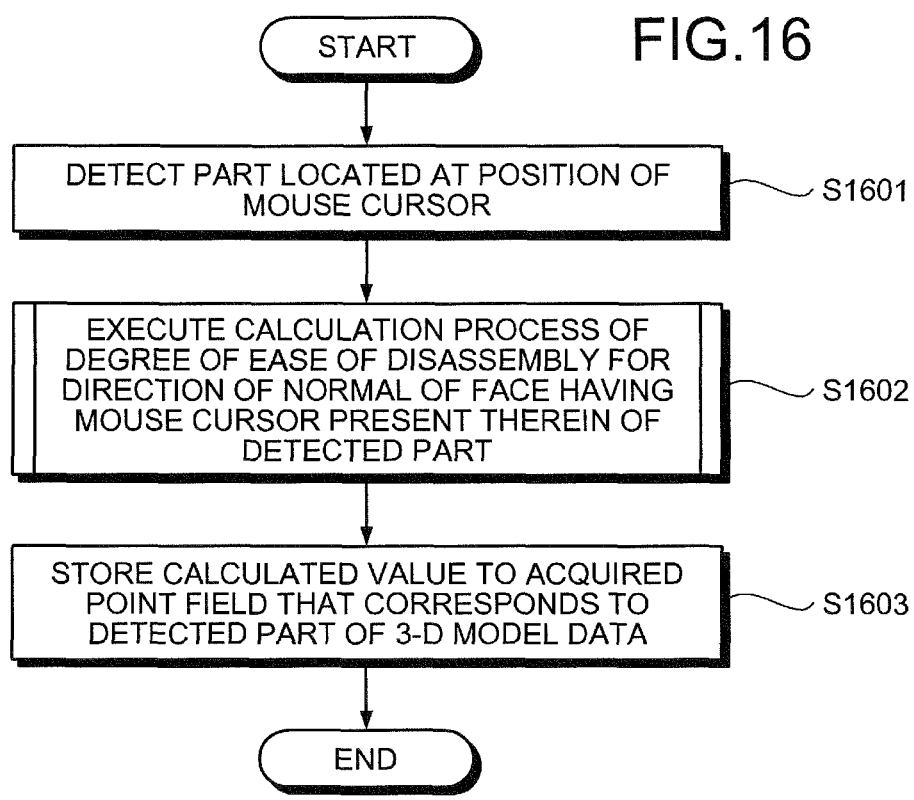
FIG. 16 is a flowchart of an example of a procedure of an updating process of the degree of ease of disassembly.

FIG. 16 is a flowchart of an example of a procedure of the updating process of the degree of ease of disassembly. The updating process of the degree of ease of disassembly is a process of updating the value of the degree of ease of disassembly stored in the acquired point field of the 3-D model data 312. The assembly sequence generating apparatus 100 detects a part located at the position of the mouse cursor (step S1601) and executes a calculation process of the degree of ease of disassembly for the direction of the normal of the face having the mouse cursor present therein of the detected part (step S1602). The details of the calculation process of the degree of ease of disassembly will be described later with reference to FIG. 17.

The assembly sequence generating apparatus 100 stores the calculated value of the degree of ease of disassembly, in the acquired point field that corresponds to the detected part of the 3-D model data (step S1603). After the process at step S1603 comes to an end, the assembly sequence generating apparatus 100 causes the updating process of the degree of ease of disassembly. The assembly sequence generating apparatus 100 can update the acquired point field for the part pointed by the mouse cursor, by executing the updating process for the degree of ease of disassembly.

Figure 17:
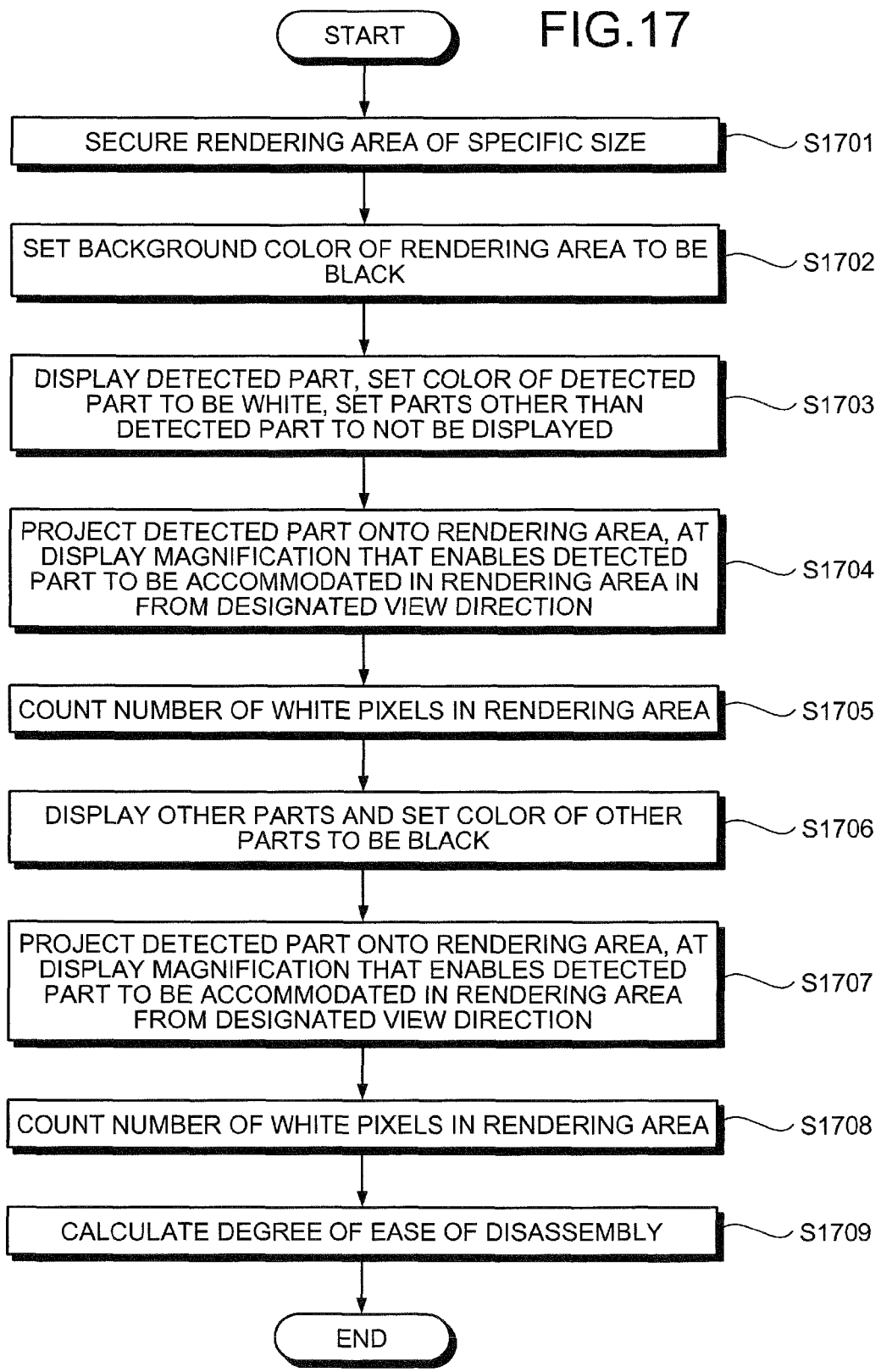
FIG. 17 is a flowchart of an example of a procedure for a calculation process of the degree of ease of disassembly.

FIG. 17 is a flowchart of an example of a procedure for the calculation process of the degree of ease of disassembly. The calculation process of the degree of ease of disassembly is a process of calculating the degree of ease of disassembly acquired when the detected part is observed from a designated direction. The designated direction is the normal line direction of the face having the mouse cursor present therein of the detected part.

The assembly sequence generating apparatus 100 secures a rendering area of a specific size (step S1701), sets the background color of the rendering area to be black (step S1702), displays the detected part, sets the color of the detected part to be white, sets the parts other than the detected part of the parts included in the product to not be displayed (step S1703), projects the detected part onto the rendering area, at a display magnification that enables the detected part to be accommodated in the rendering area from the designated view direction (step S1704), and counts the number of white pixels in the rendering area (step S1705).

The assembly sequence generating apparatus 100 displays the other parts and sets the color of the other parts to be black (step S1706), projects the detected part onto the rendering area, at the display magnification that enables the detected part to be accommodated in the rendering area from the designated view direction (step S1707), counts the number of white pixels in the rendering area (step S1708), and calculates the degree of ease of disassembly (step s1709).

For example, the assembly sequence generating apparatus 100 calculates as the degree of ease of disassembly, the number of pixels acquired by the process at step s1708/the number of pixels acquired by the process at step S1705*100. After the process at step S1709 comes to an end, the assembly sequence generating apparatus 100 causes the calculation process of the degree of ease of disassembly to come to an end. The assembly sequence generating apparatus 100 can acquire the degree of ease of disassembly in the designated direction by executing the calculation process of the degree of ease of disassembly.

Figure 18:
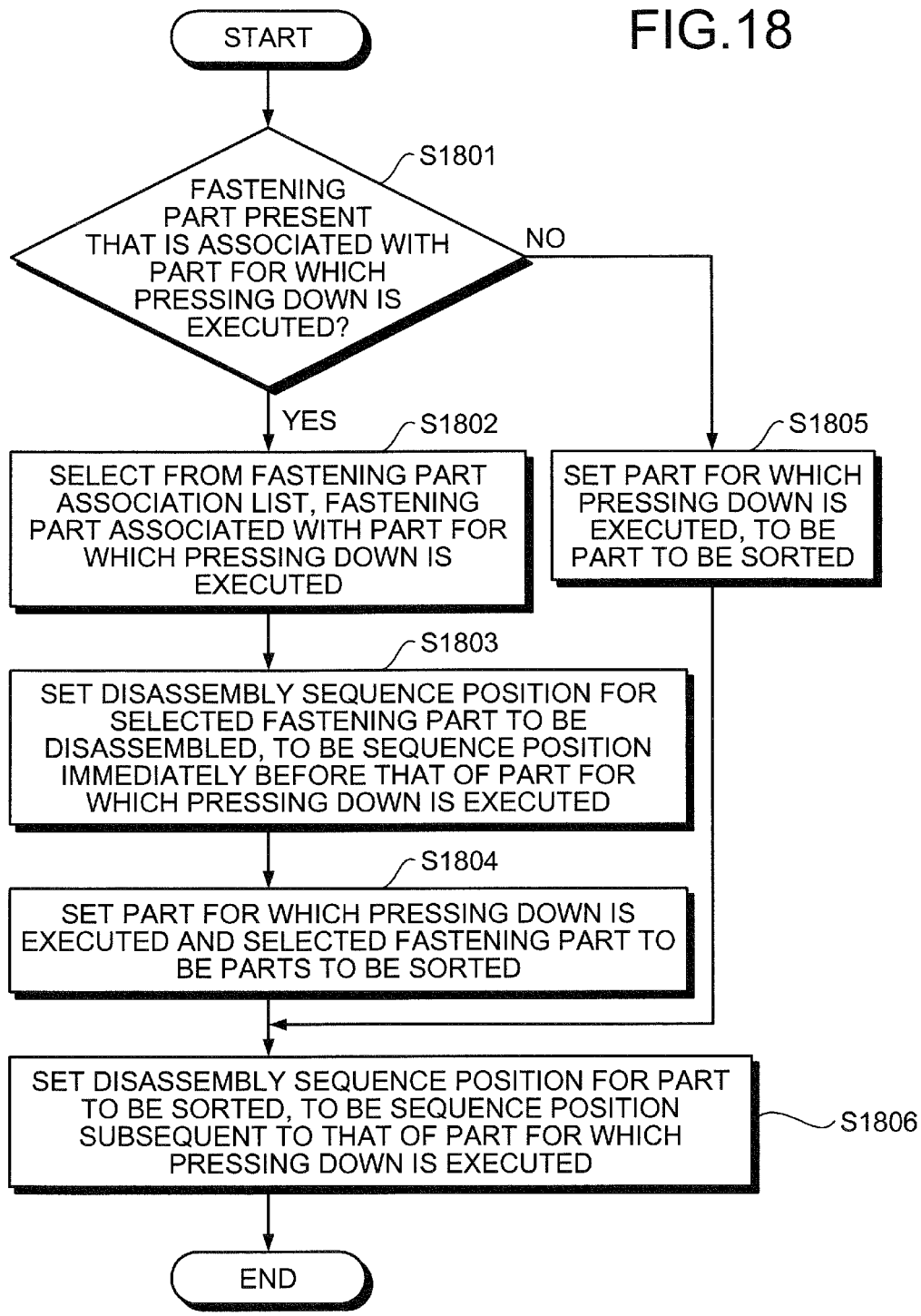
FIG. 18 is a flowchart of an example of a procedure for a sorting process.

FIG. 18 is a flowchart of an example of a procedure for the sorting process. The sorting process is a process of changing the sequence position for the part for which the pressing down is executed, to be disassembled. The assembly sequence generating apparatus 100 refers to the fastening part association list 702 and determines whether any fastening part is present that is associated with the part for which the pressing down is executed (step S1801). If the assembly sequence generating apparatus 100 determines that a fastening part is present that is associated with the part for which the pressing down is executed (step S1801: YES), the assembly sequence generating apparatus 100 selects the fastening part associated with the part for which the pressing down is executed from the fastening part association list 702 (step S1802), sets the disassembly sequence position for the selected fastening part to be disassembled, to be the sequence position immediately before that of the part for which pressing down is executed (step S1803), and sets the part for which the pressing down is executed and the selected fastening part to be the parts to be sorted (step S1804).

If the assembly sequence generating apparatus 100 determines that no fastening part is present that is associated with the part for which the pressing down is executed (step S1801: NO), the assembly sequence generating apparatus 100 sets the part for which the pressing down is executed, to be a part to be sorted (step S1805).

After the process at step S1804 or S1805, the assembly sequence generating apparatus 100 sets the disassembly sequence position for the part to be sorted, to be the sequence position subsequent to that of the part for which the pressing down is executed (step S1806). After the process at step S1806 comes to an end, the assembly sequence generating apparatus 100 causes the sorting process to come to an end. By executing the sorting process, the assembly sequence generating apparatus 100 can set, by one click operation, the disassembly sequence positions for the part selected by the clicking and the fastening part associated therewith to be disassembled and therefore, the operation amount can be reduced for the user.

As above, according to the assembly sequence generating apparatus 100, the part selected by the user is erased on the screen; the selection order is stored; and the reverse sequence of the selection sequence is determined as the assemble sequence of the product. Thereby, with the assembly sequence generating apparatus 100, one operation to determine the assembly sequence position for the part to be assembled in the assembly sequence of the product is one click operation, whereby the amount of operations is reduced for the user. With the assembly sequence generating apparatus 100, the operation to determine the assembly sequence of the product is the click operation and therefore, when the assembly sequence of the product is determined, the processing amount can be reduced compared to that of the drag and drop operation and the cut and paste operation. For example, in the drag and drop operation, a rendering process is generated for the currently dragged icon itself or the frame of the icon. In the cut and paste operation, a rendering process is generated for the context menu. The click operation does not cause any such rendering process to be generated and therefore, the assembly sequence generating apparatus 100 can reduce the processing amount.

The assembly sequence generating apparatus 100 causes the selected part to not be displayed and thereby, regenerates the state where the 3-D model is disassembled. Therefore, the user can operate the assembly sequence generating apparatus 100 without changing the thinking executed by the user in the actual duty of discussing the manufacture flow. With the assembly sequence generating apparatus 100, the time period consumed for the operation thereof is shorter than that consumed for operations such as the drag and drop operation or the cut and paste operation and therefore, the assembly sequence of the product can be generated at a higher speed and the time period can be reduced during which the thinking of the user is interrupted.

According to the assembly sequence generating apparatus 100, the fastening part and non-fastening part to be fastened by the fastening part may be stored being associated with each other. The assembly sequence generating apparatus 100 can further reduce the clicking sessions by the user by using the pieces of information associated with each other. For example, representing the number of parts included in the 3-D model as "n" and the number of fastening parts included therein as "m", the assembly sequence generating apparatus 100 can generate the assembly sequence of the product with n−m clicking sessions. The assembly sequence generating apparatus 100 may be capable of separating a mode to generate the assembly sequence of the product and a normal mode to execute move, rotation, etc., of the part, from each other. In this case, the assembly sequence generating apparatus 100 switches the mode thereof from the normal mode to the mode to generate the assemble sequence of the product and, after generating the assembly sequence of the product, switches the mode thereof to the normal mode. In this operation, the assembly sequence generating apparatus 100 can generate the assembly sequence of the product with n−m+2 clicking sessions.

According to the assembly sequence generating apparatus 100, the information may be displayed that indicates the degree of ease of disassembly of the selected part. Thereby, the assembly sequence generating apparatus 100 can notify the user of the degree of ease of disassembly the part and therefore, the user can generate a reliable assembly sequence of the product even when the user has a small amount of knowledge of disassembly the parts.

The assembly sequence generating method described in the present embodiment may be implemented by executing a prepared program on a computer such as a personal computer and a workstation. The program is stored on a computer-readable recording medium such as a hard disk, a flexible disk, a CD-ROM, an MO, and a DVD, read out from the computer-readable medium, and executed by the computer. The program may be distributed through a network such as the Internet.

According to an aspect of the embodiments, the amount of operations performed by the user when the assembly sequence of a product is determined can be reduced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium storing an assembly sequence generating program that causes a computer to execute a process comprising:
   displaying parts other than fastening parts on the display unit, the parts and the fastening parts being included in a 3-D model, the fastening parts being set in advance to not be displayed;
   causing parts sequentially selected from the displayed parts in the 3-D model to not be displayed;
   identifying a specific fastening part when a specific part is selected, the specific part being included in the displayed parts in the 3-D model, the specific fastening part fastening the specific part; and
   storing, to a storing unit, a reverse sequence of a sequence of the selection of the displayed parts as an assembly sequence of the 3-D model, the specific fastening part being associated with the specific part in the assembly sequence.

2. The non-transitory computer-readable recording medium according to claim 1, the process further comprising:
   calculating a degree indicating ease of disassembly of each part selected in the 3-D model; and
   displaying, on the display unit, information that indicates the degree of ease of disassembly according to ease of disassembly.

3. An assembly sequence generating apparatus comprising a computer configured to:
   control a display unit to display parts other than fastening parts of a 3-D model, the fastening parts being set in advance to not be displayed;
   set, when the parts other than the fastening parts included in the 3-D model displayed on the display unit are sequentially selected, the selected parts to not be displayed;
   identify a specific fastening part when a specific part is selected, the specific part being included in the displayed parts in the 3-D model, the specific fastening part fastening the specific part; and
   store, to a memory unit, a reverse sequence of a sequence of the selection of the displayed parts as an assembly sequence of the 3-D model, the specific fastening part being associated with the specific part in the assembly sequence.

4. A manufacturing method comprising:
   displaying, on a display unit, parts other than fastening parts of a 3-D model that simulates a product, the fastening parts being set in advance to not be displayed;
   causing parts sequentially selected from the displayed parts in the 3-D model to not be displayed;
   identifying a specific fastening part when a specific part is selected, the specific part being included in the displayed parts in the 3-D model, the specific fastening part fastening the specific part;
   storing, to a storing unit, a reverse sequence of a sequence of the selection of the displayed parts as an assembly sequence of the 3-D model, the specific fastening part being associated with the specific part in the assembly sequence; and
   manufacturing the product according to the stored assembly sequence.

* * * * *